United States Patent
Su et al.

(10) Patent No.: US 10,686,032 B2
(45) Date of Patent: Jun. 16, 2020

(54) HIGH VOLTAGE RESISTOR WITH HIGH VOLTAGE JUNCTION TERMINATION

(71) Applicant: Taiwan Semiconductor Manufacturing Company, Ltd., Hsin-Chu (TW)

(72) Inventors: Ru-Yi Su, Yunlin County (TW); Fu-Chih Yang, Fengshan (TW); Chun Lin Tsai, Hsin-Chu (TW); Chih-Chang Cheng, Hsin-Chu (TW); Ruey-Hsin Liu, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/185,735

(22) Filed: Jun. 17, 2016

(65) Prior Publication Data
US 2016/0293694 A1 Oct. 6, 2016

Related U.S. Application Data

(63) Continuation of application No. 13/195,156, filed on Aug. 1, 2011, now Pat. No. 9,373,619.

(51) Int. Cl.
*H01L 29/66* (2006.01)
*H01L 29/06* (2006.01)
(Continued)

(52) U.S. Cl.
CPC ........ *H01L 29/0646* (2013.01); *H01L 23/535* (2013.01); *H01L 27/0802* (2013.01);
(Continued)

(58) Field of Classification Search
CPC ............ H01L 29/0646; H01L 29/0615; H01L 29/0619; H01L 29/0623; H01L 29/063;
(Continued)

(56) References Cited

U.S. PATENT DOCUMENTS 4,288,806 A 9/1981 Ronen
4,750,028 A 6/1988 Ludikhuize
(Continued)

FOREIGN PATENT DOCUMENTS

TW 233703 6/2005

OTHER PUBLICATIONS

Endo, Koichi, et al., "A 500V 1A 1-Chip Inverter IC With a New Electric Field Reduction Structure", Proc. Of the 6th Internat. Symposium on Power Semiconductor Devices & IC's, Davos, Switzerland, May-Jun. 2, 1994, IEEE, Cat. No. 94CH3377-9, pp. 379-383.
(Continued)

*Primary Examiner* — Monica D Harrison
*Assistant Examiner* — John Lin
(74) *Attorney, Agent, or Firm* — Haynes and Boone, LLP

(57) ABSTRACT

High voltage semiconductor devices are described herein. An exemplary semiconductor device includes a first doped region and a second doped region disposed in a substrate. The first doped region and the second doped region are oppositely doped and adjacently disposed in the substrate. A first isolation structure and a second isolation structure are disposed over the substrate, such that each are disposed at least partially over the first doped region. The first isolation structure is spaced apart from the second isolation structure. A resistor is disposed over a portion of the first isolation structure and electrically coupled to the first doped region. A field plate disposed over a portion of the second doped region and electrically coupled to the second doped region.

20 Claims, 19 Drawing Sheets

(51) Int. Cl.
*H01L 29/40* (2006.01)
*H01L 29/861* (2006.01)
*H01L 49/02* (2006.01)
*H01L 27/08* (2006.01)
*H01L 23/535* (2006.01)
*H01L 29/36* (2006.01)
*H01L 29/78* (2006.01)

(52) U.S. Cl.
CPC ............ *H01L 28/20* (2013.01); *H01L 29/063* (2013.01); *H01L 29/0623* (2013.01); *H01L 29/36* (2013.01); *H01L 29/404* (2013.01); *H01L 29/405* (2013.01); *H01L 29/66136* (2013.01); *H01L 29/8611* (2013.01); *H01L 29/7835* (2013.01)

(58) Field of Classification Search
CPC .............. H01L 29/0634; H01L 29/405; H01L 29/7816; H01L 29/7823; H01L 28/20–26; H01L 21/76; H01L 21/762; H01L 21/76202; H01L 21/76205
See application file for complete search history.

(56) References Cited

U.S. PATENT DOCUMENTS

| | | | |
|---|---|---|---|
| 5,382,826 | A | 1/1995 | Mojaradi et al. |
| 5,486,718 | A | 1/1996 | Robb et al. |
| 5,552,625 | A | 9/1996 | Murakami et al. |
| 5,585,640 | A | 12/1996 | Huston et al. |
| 6,225,647 | B1 | 5/2001 | Kurtz et al. |
| 6,525,390 | B2 | 2/2003 | Tada et al. |
| 6,603,185 | B1 * | 8/2003 | Jimbo ................. H01L 27/0611 257/488 |
| 6,677,680 | B2 | 1/2004 | Gates et al. |
| 6,680,515 | B1 | 1/2004 | Hsing |
| 6,770,517 | B2 | 8/2004 | Nakaoka et al. |
| 6,784,077 | B1 | 8/2004 | Lin et al. |
| 7,279,753 | B1 | 10/2007 | O et al. |
| 2001/0048122 | A1 * | 12/2001 | Tada ..................... H01L 29/402 257/240 |
| 2002/0135019 | A1 * | 9/2002 | Noda ..................... H01L 29/404 257/367 |
| 2004/0155317 | A1 | 8/2004 | Bhattacharyya |
| 2004/0227140 | A1 | 11/2004 | Lee et al. |
| 2006/0163691 | A1 * | 7/2006 | Hall ..................... H01L 27/0288 257/528 |
| 2007/0020840 | A1 | 1/2007 | Chindalore |
| 2008/0090346 | A1 | 4/2008 | Chen et al. |
| 2008/0142830 | A1 | 6/2008 | Huang et al. |
| 2010/0073076 | A1 | 3/2010 | Fu et al. |
| 2012/0086052 | A1 * | 4/2012 | Chen ................. H01L 29/0607 257/288 |

OTHER PUBLICATIONS

Unpublished U.S. Appl. No. 12/652,294, "High Voltage Devices and Methods for Forming The High Voltage Devices" filed Jan. 5, 2010, 30 pages.
Ktata, M. Faiez, et al., "When Are Substrate Effects Important for On-Chip Interconnects?", 0-7803-8128-9/03, 2003 IEEE, pp. 265-268.
Unpublished U.S. Appl. No. 13/100,714, "High Voltage Resistor with Biased-Well," filed May 4, 2008, 26 pages.
Canham, L. T., "Silicon quantum wire array fabrication by electrochemical and chemical dissolution of wafers," Appl. Phys. Lett., vol. 57, No. 10 (Sep. 3, 1990) pp. 1046-1048.
Liu, C. W., et al., "Hot carrier recombination model of visible electroluminescence from metal-oxide silicon tunneling diodes," Appl. Phys. Lett. vol. 77, No. 26 (Dec. 25, 2000) pp. 4347-4349.
Rebohle, L., et al, "Strong blue and violet photoluminescence and electroluminescence from germanium-implanted and silicon-implanted silicon-dioxide layers," Appl. Phys. Lett., vol. 71, No. 19 (Nov. 10, 1997) pp. 2809-2811.
Shcheglov, K. V., et al., "Electroluminescence and photoluminscence of Ge-implanted Si/SiO2/Si structures," Appl. Phys. Lett., vol. 66, No. 6 (Feb. 6, 1995) pp. 745-747.
Shimizu-Iwayama, Tsutomo, et al., "Visible photoluminescence in Si+ implanted silica glass," J. Appl. Phys., vol. 75 No. 12 (Jun. 15, 1994) pp. 7779-7783.
Unpublished U.S. Appl. No. 13/160,030, filed Jun. 14, 2011 entitled "High Voltage Resistor With Pin Diode Isolation", 38 pages.
F. Udrea, "State-of-the-Art Technologies and Devices for High-Voltage Integrated Circuits" IET Circuits Devices Syst., 2007, 1, (5), pp. 357-365.

* cited by examiner

HIGH VOLTAGE RESISTOR WITH HIGH VOLTAGE JUNCTION TERMINATION

PRIORITY DATA

The present application is a continuation application of U.S. patent application Ser. No. 13/195,156, filed Aug. 1, 2011, which is hereby incorporated by reference in its entirety

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Various types of passive circuit components may be fabricated on a semiconductor wafer. For example, a resistor may be formed as a passive circuit component on a wafer. Some applications require these resistors to withstand high voltages, for example voltages as high as a few hundred volts. However, conventional high voltage resistors may suffer from device breakdown issues before a sufficiently-high voltage is reached. For example, conventional high voltage resistors may rely on using a P/N junction to sustain a breakdown voltage. Junction breakdown is limited by doping concentration, which has not been optimized in conventional high voltage resistors.

Therefore, while existing high voltage resistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
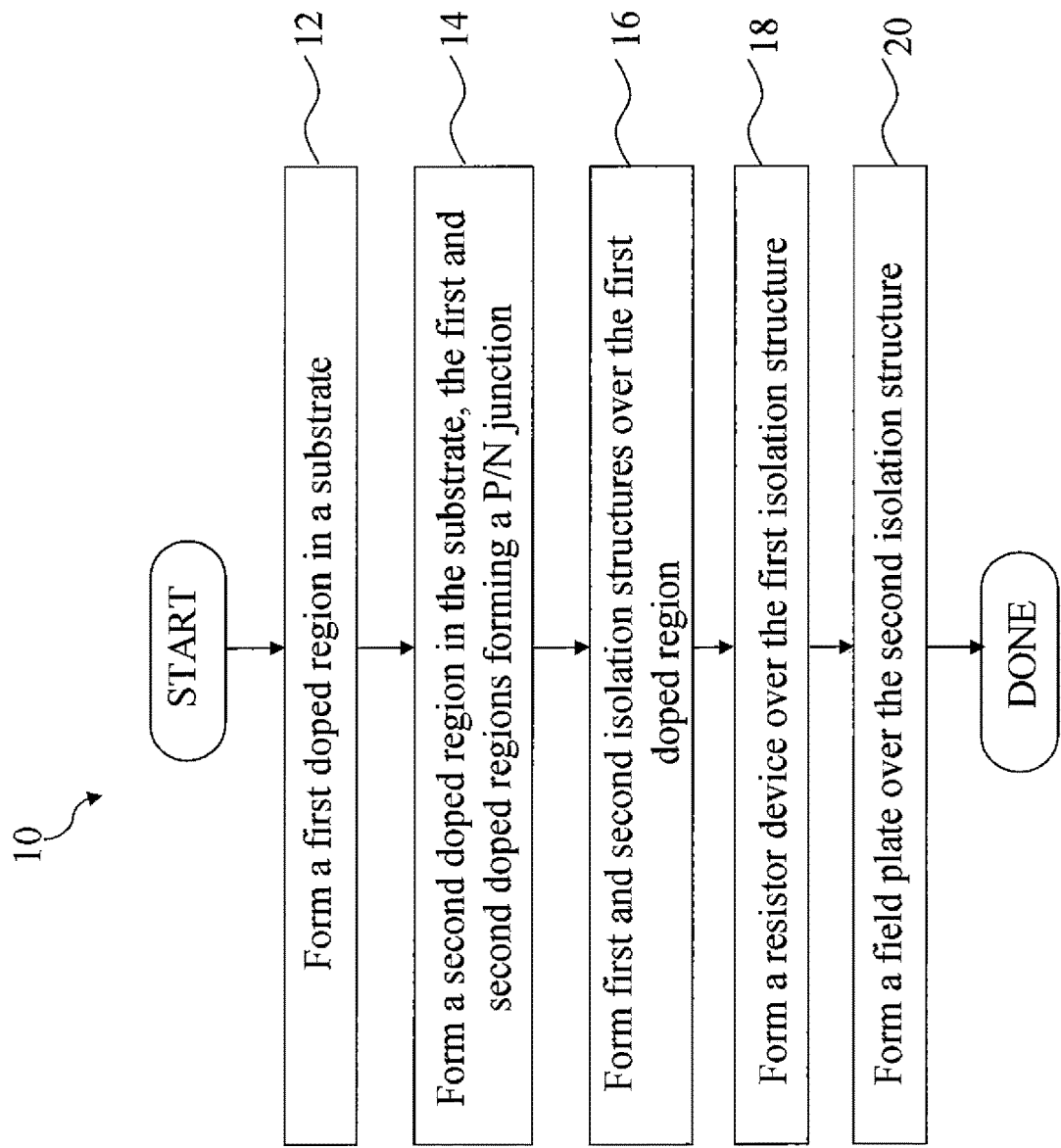
FIG. 1 is a flowchart illustrating a method for fabricating a high voltage semiconductor device according to various aspects of the present disclosure.

Illustrated in FIG. 1 is a flowchart of a method 10 according to various aspects of the present disclosure. The method 10 includes block 12 in which a first doped region is formed in a substrate. The method 10 includes block 14 in which a second doped region is formed in the substrate. The second doped region is oppositely doped from the first doped region. An interface between the first and second doped regions forms a P/N junction. The method 10 includes block 16 in which first and second isolation structures are formed over the first doped region. The method 10 includes block 18 in which a resistor device is formed over the first isolation structure. The method 10 includes block 20 in which a field plate is formed at least partially over the second isolation structure. The field plate is disposed over the P/N junction.

FIGS. 2-13 are diagrammatic fragmentary cross-sectional side views of various portions of a semiconductor wafer at various fabrication stages according to embodiments of the present disclosure. It is understood that FIGS. 2 to 13 have been simplified for a better understanding of the inventive concepts of the present disclosure.

Figure 2:
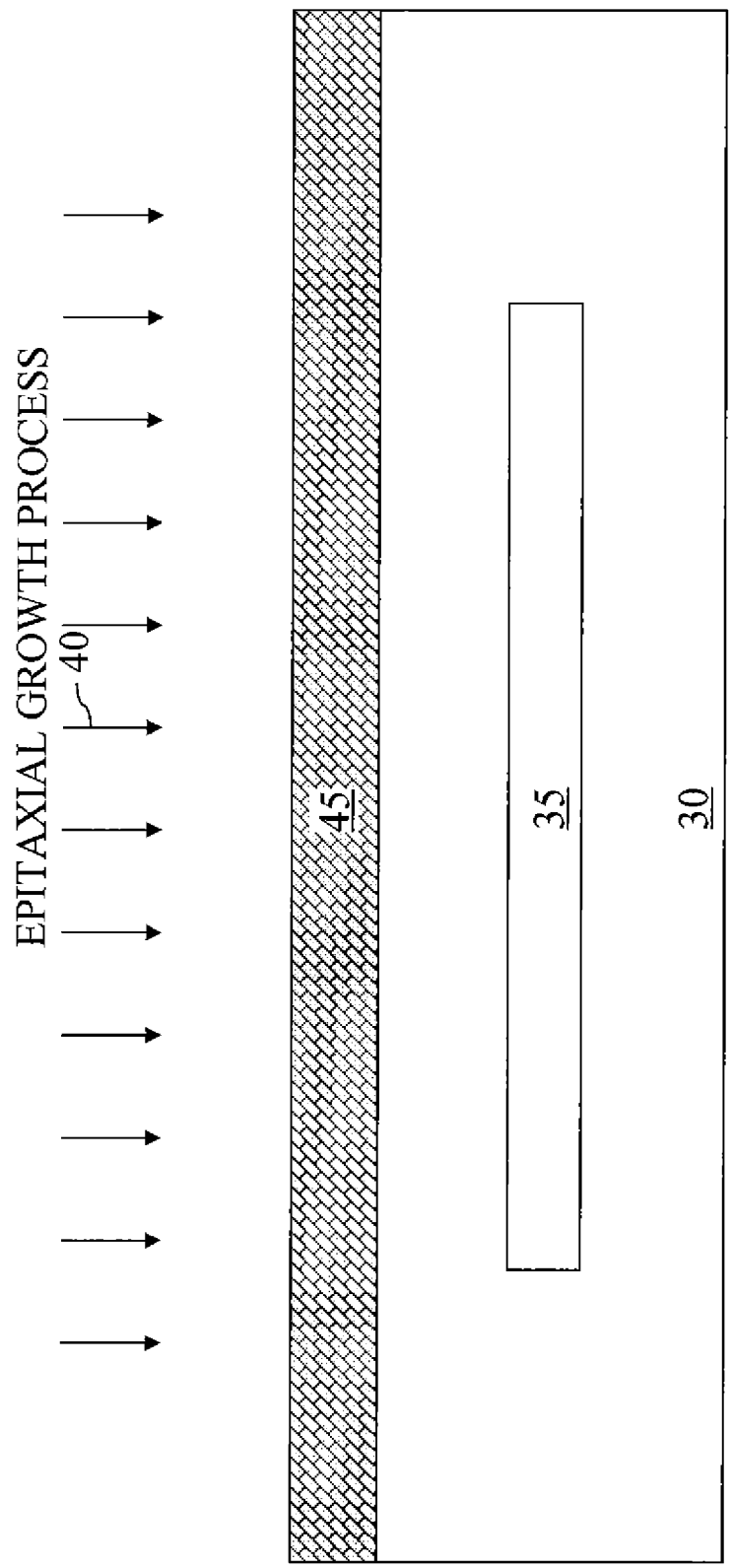
FIGS. 2-13 are diagrammatic fragmentary cross-sectional side views of a portion of a wafer at various stages of fabrication in accordance with various aspects of the present disclosure.

Referring to FIG. 2, a portion of a substrate 30 is illustrated. The substrate 30 is doped with a P-type dopant such as boron. In another embodiment, the substrate 30 may be doped with an N-type dopant such as phosphorous or arsenic. The substrate 30 may also include other suitable elementary semiconductor materials, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

A buried well 35 is formed in a portion of the substrate 30 through an ion implantation process known in the art. The buried well 35 is formed to have an opposite doping polarity to that of the substrate 30. In the illustrated embodiment, the buried well 35 is N-type doped, since the substrate 30 herein is a P-type substrate. In another embodiment where the substrate 30 is an N-type substrate, the buried well 35 is P-type doped. The buried well 35 may be formed by an implantation process having a dose that is in a range from about $1 \times 10^{12}$ atoms/centimeter$^2$ to about $2 \times 10^{12}$ atoms/centimeter$^2$. The buried well 35 may have a doping concentration that is in a range from about $1 \times 10^{15}$ atoms/centimeter$^3$ to about $1 \times 10^{16}$ atoms/centimeter$^3$. It is understood that a patterned photoresist layer may be formed over an upper surface of the substrate before the implantation process is performed. The patterned photoresist layer serves as a mask during the implantation process. After the formation of the buried well 35, an epitaxial growth process 40 is performed to form an epi-layer 45 over the substrate 30 and over the buried well 35.

Figure 3:
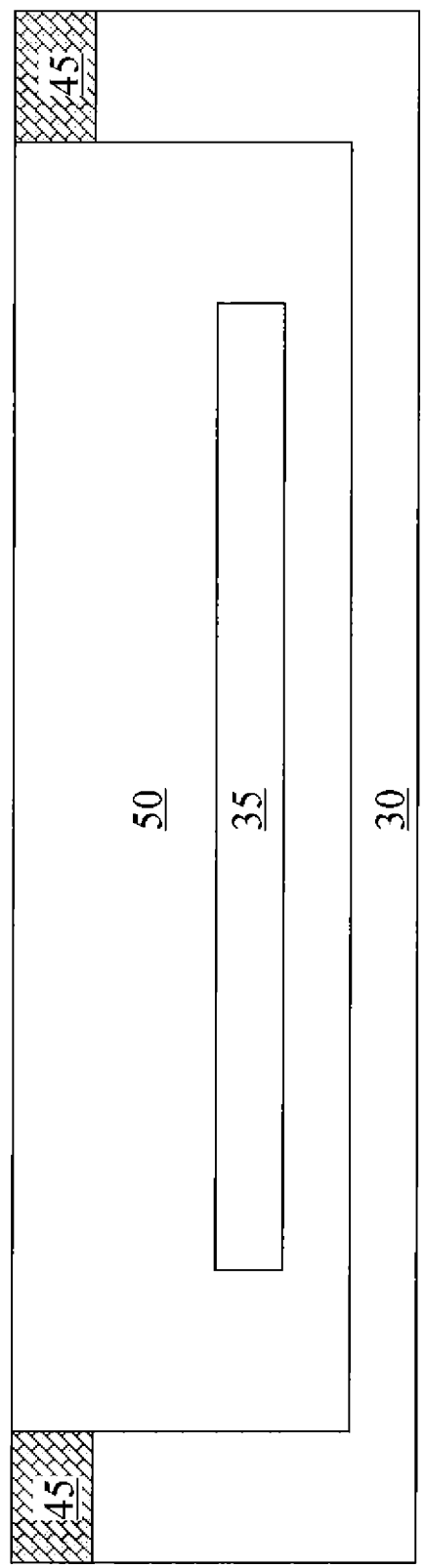

Referring now to FIG. 3, a high-voltage doped well 50 is formed in the substrate 30. The high-voltage doped well 50 is formed by an ion implantation process known in the art. For example, the doped well 50 may be formed by an implantation process having a dose that is in a range from about $3 \times 10^{12}$ atoms/centimeter$^2$ to about $4 \times 10^{12}$ atoms/centimeter$^2$. In an embodiment, the high-voltage doped well has a doping concentration that is in a range from about $1 \times 10^{15}$ atoms/centimeter$^3$ to about $1 \times 10^{16}$ atoms/centimeter$^3$. A patterned photoresist layer (not illustrated) may be formed over the substrate 35 as a mask during the implantation process. The high-voltage doped well 50 is doped with the same doping polarity as the buried well 35 (opposite from that of the substrate 30). Thus, the high-voltage doped well is a high-voltage N-well (HVNW) in the illustrated embodiment. The high-voltage 50 is formed in a manner such that it surrounds the buried well 35. It is understood that in some embodiments, the buried well 35 may be considered to be a part of the high-voltage 50, or that they may be collectively referred to as an N-drift region or as HVNW/BNW. For the sake of simplicity, the buried well 35 is not specifically shown in the following Figures.

Figure 4:
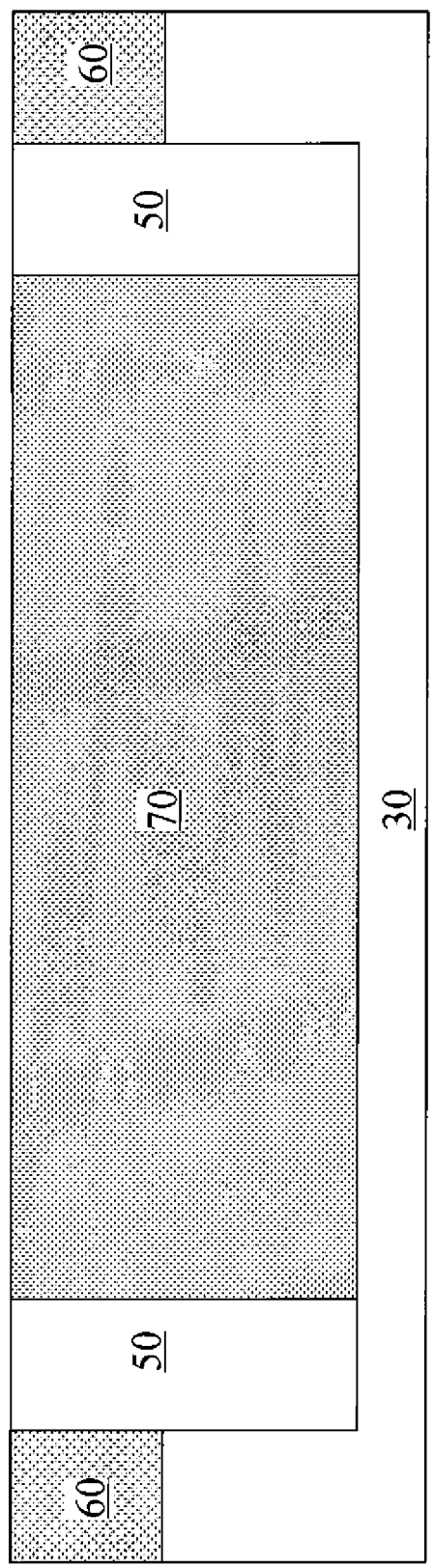

Referring now to FIG. 4, doped wells 60 are formed in portions of the substrate adjacent to the N-drift region 50. In an embodiment, the doped wells 60 cover the epi-layer 45. The doped wells 60 may be formed by an ion implantation process known in the art. The doped wells 60 are doped with the same doping polarity as that of the substrate 30 (and opposite of the N-drift region 50). Thus, in the embodiment shown, the doped wells 60 are formed to be P-wells. In an embodiment, the doped wells 60 are formed using an ion implantation process and has a concentration level that is in a range from about $5 \times 10^{15}$ atoms/centimeter$^3$ to about $5 \times 10^{16}$ atoms/centimeter$^3$.

Still referring to FIG. 4, a doped well 70 is formed in the N-drift region 50. The doped well 70 is formed using another ion implantation process known in the art. The doped well 70 has the same doping polarity as the N-drift region 50 and has a greater doping concentration level than the N-drift region 50. Thus, in the embodiment shown, the doped well 70 is a more heavily-doped N-well. In an embodiment, the doped well 70 has a doping concentration level that is in a range from about $1 \times 10^{16}$ atoms/centimeter$^3$ to about $1 \times 10^{17}$ atoms/centimeter$^3$.

Figure 5:
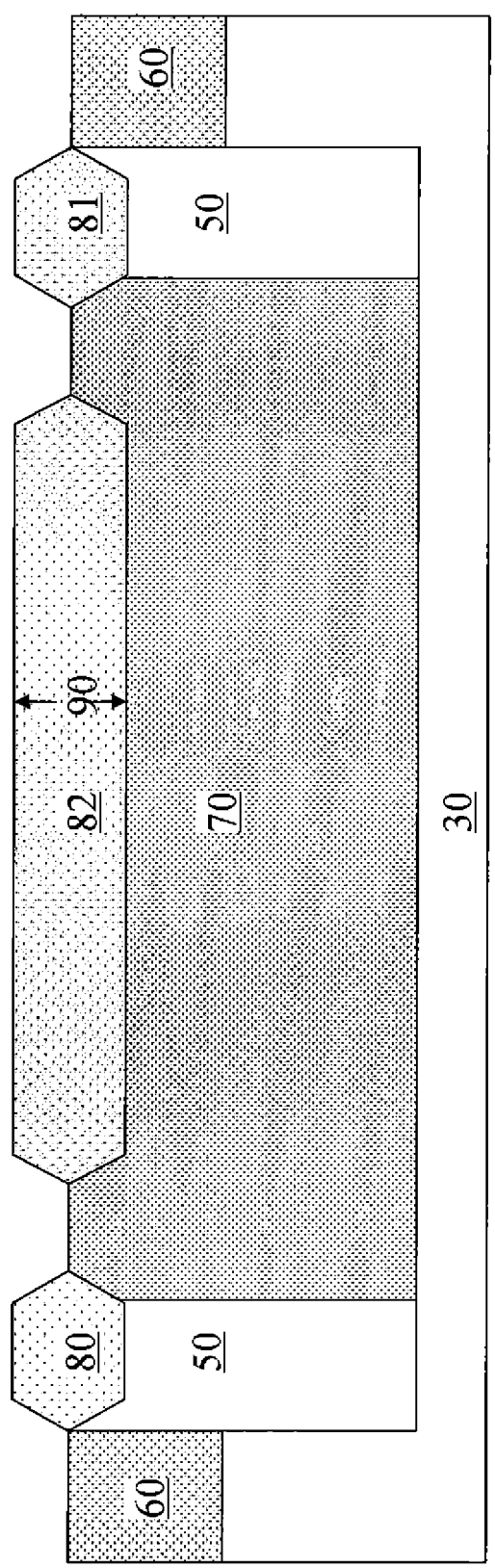

Referring now to FIG. 5, isolation structures 80-81 are formed over the N-drift region 50, and an isolation structure 82 is formed over the doped well 70. The isolation structures 80-82 may include a dielectric material. The isolation structure 82 has a thickness 90. In an embodiment, the thickness 90 is in a range from about 0.2 microns (um) to about 1 um. In the embodiment shown in FIG. 5, the isolation structures 80-82 are Local Oxidation of Silicon (LOCOS) devices (also referred to as field oxide). The LOCOS devices may be formed using a nitride mask and thermal-growing an oxide material through the mask openings. Alternatively, the isolation structures 80-82 may include shallow trench isolation (STI) devices or deep trench isolation (DTI) devices. Thereafter, active regions of transistors are defined, which may include source/drain regions of a Field Effect Transistor (FET) device.

Figure 6:
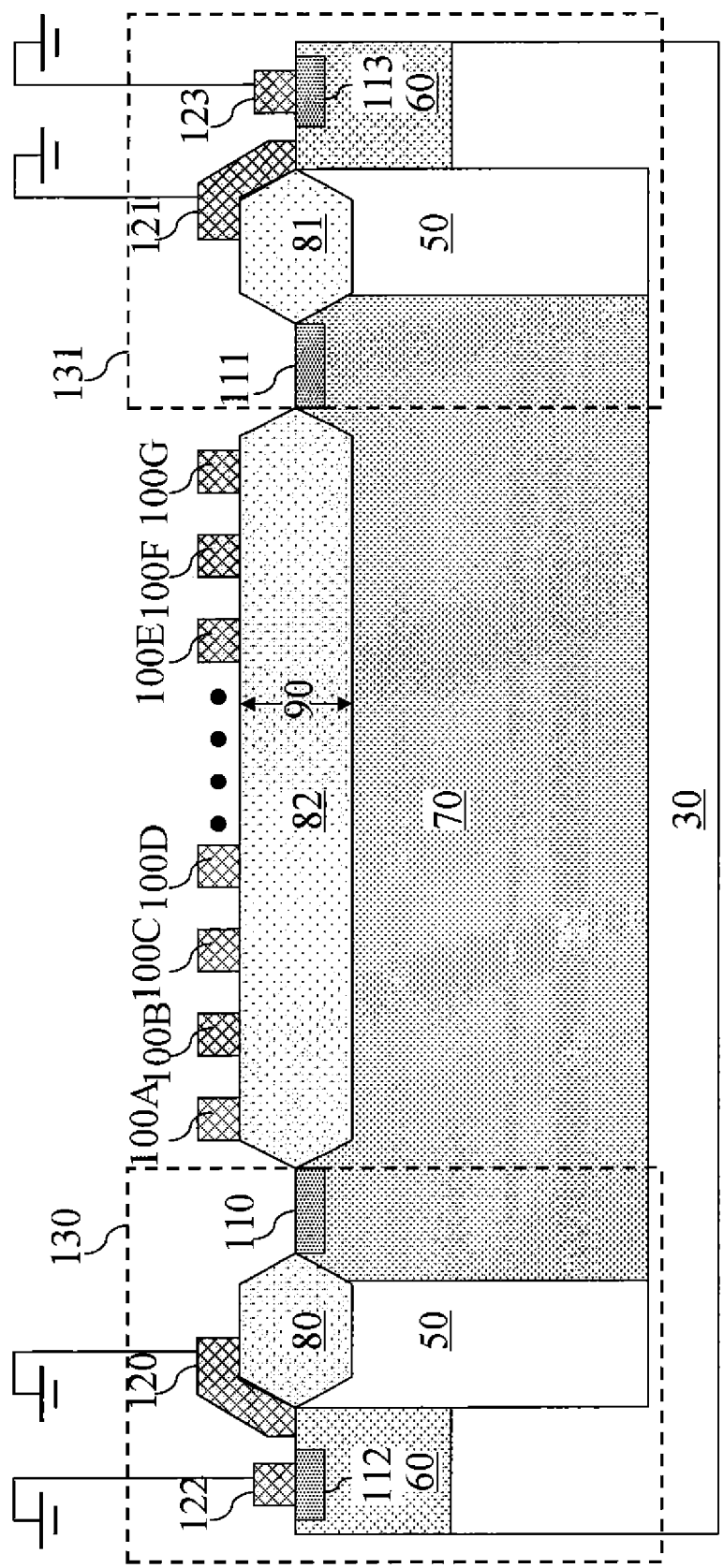

Referring now to FIG. 6, a resistor device 100 is formed over the isolation structure 82. The resistor device 100 has an elongate and winding shape. In one embodiment, the resistor device 100 has a zig-zag (or an S shape). In another embodiment, the resistor device 100 has a spiral shape. In yet another embodiment, the resistor device 100 has a square shape. These shapes will be more clearly viewed with reference to FIGS. 14-17 below, which illustrate top views of various embodiments of the resistor device 100. In the cross-sectional view shown in FIG. 6, the resistor device 100 appears as a plurality of resistor blocks 100A-100G. It is understood, however, that these resistor blocks 100A-100G are actually parts of an individual elongate resistor device.

In an embodiment, the resistor device 100 includes a polysilicon material, and may therefore be referred to as a polysilicon resistor. The polysilicon resistor 100 is designed to handle high voltages, for example voltages greater than about 100 volts, and may be as high as a few hundred volts. Thus, the polysilicon resistor 100 may also be referred to as a high voltage device. In that case, the polysilicon resistor 100 may be formed at the same time as when other high voltage polysilicon gates are formed. In other words, the polysilicon resistor 100 may be formed using the same processes that form other high voltage polysilicon gates.

Thereafter, heavily doped regions 110-111 are formed at the upper surface of the doped well 70 and adjacent the isolation structure 82. In the embodiment shown, the heavily doped regions 110-111 are formed in between the isolation structures 80-82 and 81-82, respectively. The heavily doped regions 110-111 may be formed by one or more ion implantation processes. The heavily doped regions 110-111 have the same doping polarity (in this case N-type) as the doped well 70, but with a higher doping concentration. The heavily doped regions 110-111 have a doping concentration level that is in a range from about $1 \times 10^{19}$ atoms/centimeter$^3$ to about $1 \times 10^{20}$ atoms/centimeter$^3$.

Heavily doped regions 112-113 are also formed at the upper surface of the doped wells 60. In one embodiment, the heavily doped regions 112-113 have the same doping polarity as the doped wells 60 (P-type herein). In another embodiment, the heavily doped regions 112-113 may contain a heavily doped N-type portion as well as a heavily doped P-type portion.

A plurality of field plates 120-123 are also formed. In an embodiment, the field plate 120 is formed over an interface between the doped well 60 and the N-drift region 50. In other words, the field plate 120 is formed partially over the doped well 60 and partially over the isolation structure 80. In a similar manner, the field plate 121 is formed over an interface between the doped well 60 and the N-drift region 50 and formed partially over the isolation structure 81. The field plates 122-123 are formed over the heavily doped regions 112-113, respectively. It is also understood that field plates may be formed over the heavily doped regions 110-111, but they are not shown herein for the sake of simplicity.

In an embodiment, the field plates 120-123 contain a polysilicon material. In another embodiment, the field plates 120-123 contain a metal material. One or more of the field plates 120-123 may be formed using the same process that forms the resistor device 100 (formed at the same time as the resistor device 100). It is understood that the field plates 120-121 may serve as gate terminals of a transistor device, and the field plates 122-123 may serve as source terminals of the transistor device. The field plates 120-123 are coupled to electrical ground. Thus, the corresponding transistors each have their source and gate terminals grounded and would therefore operate in a reverse mode (i.e., the transistors are turned off). The field plates 120-123 held release or relieve the electric field in the substrate 30 (and in the various doped regions/wells formed within).

The field plates 120-123, the doped wells 50 and 60, and the isolation structures 80-81 collectively form high-voltage junction termination (HVJT) devices 130-131. The HVJT devices 130-131 help improve a breakdown voltage of the resistor device 100 through the field plates 120-123 as well as P/N junctions formed by the doped wells 50 and 60. The field plates 120-123 and the P/N junctions reduce the intensity of the electric field near the resistor device 100. As a result, the resistor device 100 can tolerate a greater voltage (compared to conventional resistor devices) before experiencing device breakdown.

Figure 7:
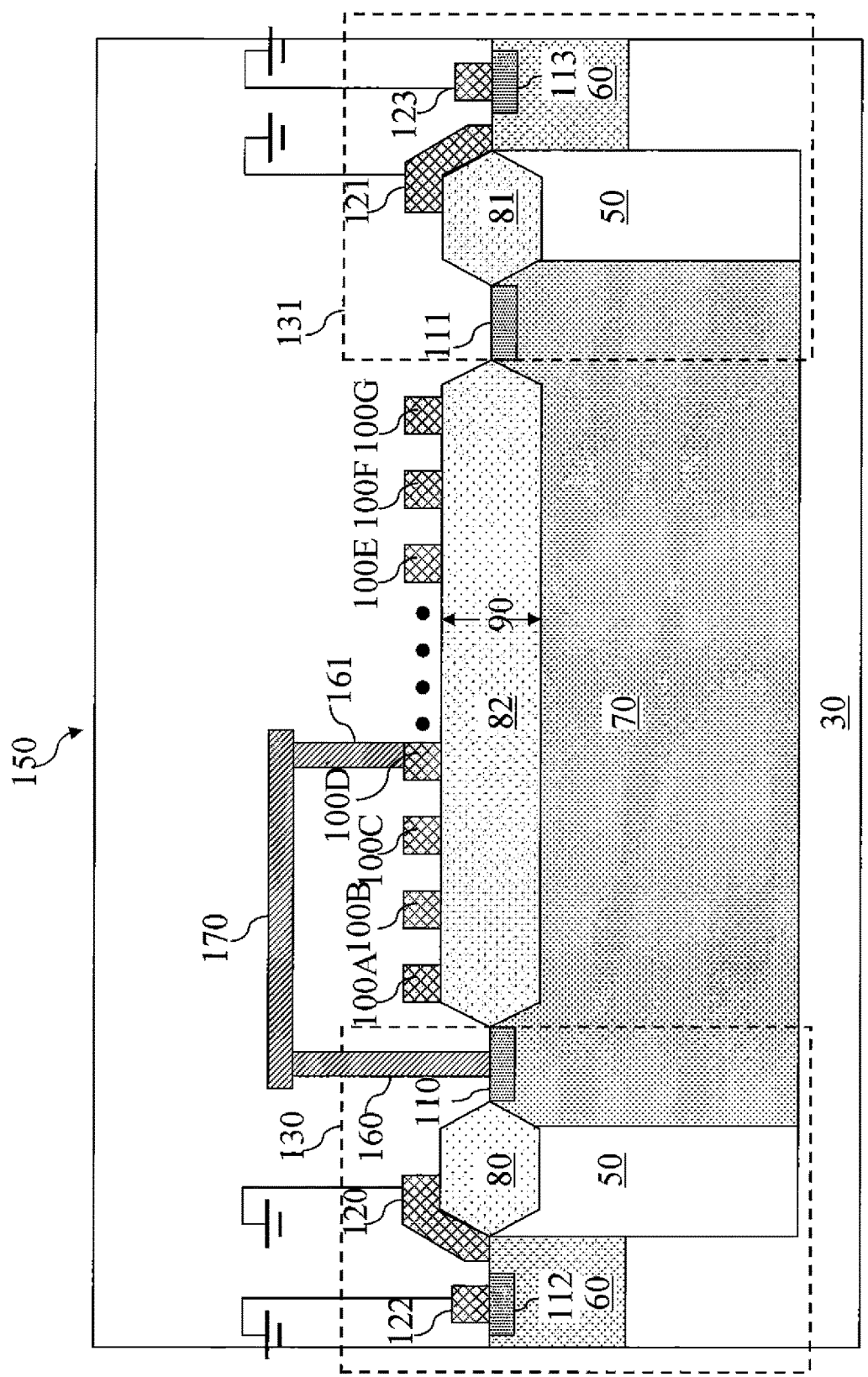

Referring now to FIG. 7, an interconnect structure 150 is formed over the isolation structures 80-82, the heavily doped regions 110-113, and the resistor device 100. The interconnect structure 150 includes a plurality of patterned dielectric layers and conductive layers that provide interconnections (e.g., wiring) between circuitries, inputs/outputs, and various doped features (for example, the N-drift region 50). In more detail, the interconnect structure 150 may include a plurality of interconnect layers, also referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 150 includes an interlayer dielectric (ILD) that provides isolation between the interconnect layers. The ILD may include a dielectric material such as a low-k material or an oxide material. The interconnect structure 150 also includes a plurality of contacts/contacts that provide electrical connections between the different interconnect layers and/or the features on the substrate, such as the doped well 70 or the resistor device 100.

As part of the interconnect structure, a contact 160 is formed on the heavily doped region 110. As such, the contact 160 is electrically coupled to the heavily doped region 110 and therefore electrically coupled to the doped well 70. An electrical bias can be applied to the doped well 70 through the contact 160. Meanwhile, another contact 161 is formed on a segment 100D of the resistor device. The segment 100D is located between two opposite distal ends of the resistor device 100 (e.g., 100A and 100G), and it is located at or near a midpoint of the resistor device 100.

The midpoint of the resistor device is a point on the resistor device that is equidistant from the two opposite distal ends. As an example, if the resistor device 100 has a total length L that is measured along all the windings or turns of the resistor device, then the midpoint of the resistor device 100 is a point that is 0.5*L away from either of the two distal ends. Resistance of a device is a function of the device's length, width, height, and material. Thus, in an embodiment where the resistor device 100 has a relatively uniform width, height, and material composition throughout, the resistance of the portion of the resistor device on either side of the midpoint is 0.5*(overall resistance of the resistor device). According to Kirchhoff's law, voltage=current*resistance. Thus, as current remains fixed, voltage varies linearly with resistance. This means that a voltage at the midpoint of the resistor device is about $0.5*(V_{High}-V_{Low})$, wherein $V_{High}$ is defined as the high voltage at one of the distal ends, and $V_{low}$ is defined as the low voltage at one of the distal ends (which is typically electrically grounded).

In the present embodiment, the segment 100D (coupled to the contact 161) is within 0.1*L of the midpoint of the resistor device 100, where L=overall length of the resistor device. Stated differently, the segment may be at, or no farther than, 0.1*L away from the midpoint. Another way of expressing this relationship is that a distance between the segment 100D and either the distal end 100A or the distal end 100G is in a range from about 0.4*L to about 0.6*L.

The interconnect structure 150 includes a metal line (or interconnect line) 170 that is electrically coupled to both the contact 160 and the contact 161. In this manner, the doped well 70 is electrically biased to the same voltage as the segment 100D of the resistor device. In other words, the voltage at the segmented 100D—which will be a percentage of the voltage applied to one of the distal ends of the resistor device 100—will be the voltage at the doped well 70. This type of biasing scheme offers advantages, which will be discussed below in more detail.

Figure 8:
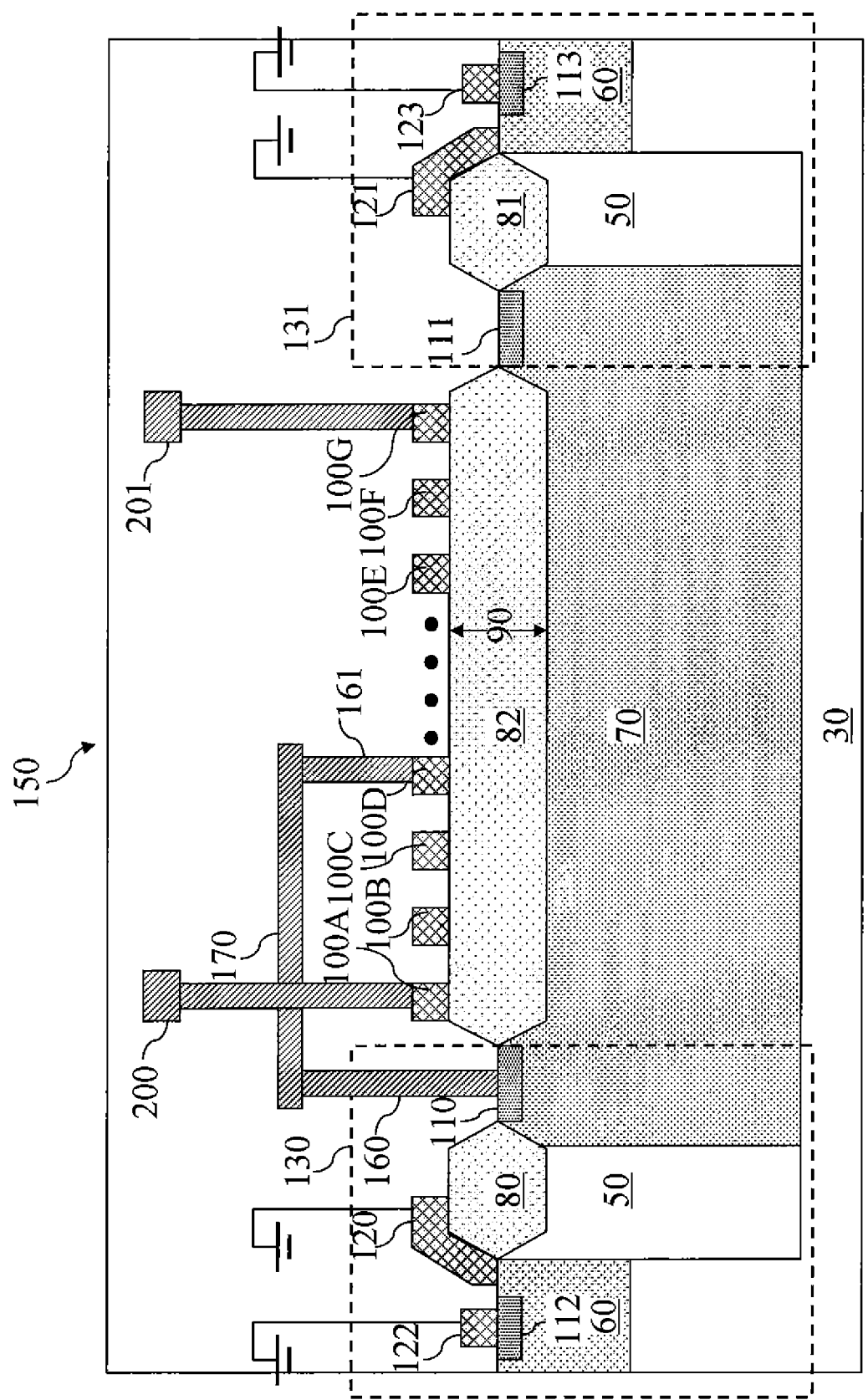

Referring now to FIG. 8, the distal end 100A of the resistor device is coupled to a terminal 200, and the distal end 100G of the resistor device is coupled to a terminal 201. The terminals 200 and 201 include conductive materials such as Al or Cu, or combinations thereof. The terminals 200 and 201 may be electrically coupled to the distal ends 100A and 100G through one or more respective contacts/contacts and/or metal lines, which are not necessarily illustrated in detail herein for the sake of simplicity. The terminals 200-201 also may or may not be formed directly over the resistor device 100.

The terminals 200 and 201 serve as electrical input/output points (or access points) for the resistor device 100. For example, a high voltage (on the order of a few hundred volts) can be applied to the terminal 200 while the terminal 201 can be grounded. Vice versa, a high voltage can be applied to the terminal 201 while the terminal 200 can be grounded.

As discussed above, the segment 100D experiences only a fraction of the high voltage applied at either the terminal 200 or the terminal 201. As an example, in an embodiment where a voltage of about 500 volts is applied to the terminal 201 and the terminal 200 is grounded, and where the segment 100D is located substantially at the midpoint of the resistor device 100, then the voltage at the segment 100D will be about 250 volts. As the location of segment 100D moves away from the midpoint and toward either the distal ends 100A or 100G, the voltage measured at the segment 100D will also drift away from 250 volts.

In an embodiment where $V_{High}$ is applied at one of the terminals 200-201, and the other one of the terminals is grounded, and the location of segment 100D is within 0.1*L away from the midpoint of the resistor device, then the voltage at the segment 100D will be in a range from about $0.4*V_{High}$ to about $0.6*V_{High}$, for example at about $0.5*V_{High}$. Since the heavily doped region 110 (and therefore the doped well 70) is tied to segment 100D, this means the doped well 70 is electrically biased to the voltage at segment 100D. In other words, the doped well 70 is electrically biased close to a middle of the voltage difference between the two terminals 200-201, which is not done in conventional high voltage devices. Thus, for conventional high voltage devices, a high voltage potential exists between the doped well 70 and one of the distal ends of the resistor device. The device may suffer breakdown issues caused by such high voltage potential. The device breakdown is typically limited by the thickness 90 of the isolation structure 82.

Typically, the conventional high voltage devices may experience device breakdown issues when $V_{High}$ exceeds about 470 volts.

In comparison, the embodiments herein electrically biases the doped well 70 to have a voltage that is close to a middle of the voltage difference between the two terminals 200-201. As such, the device can tolerate a higher voltage difference before breakdown occurs, since the voltage at the doped well 70 is not too different from either $V_{High}$ or $V_{Low}$. As an example, the device herein can tolerate a voltage difference of about 730 volts in an embodiment, as the doped well 70 is biased to about half of 730 volts, which is about 365 volts. Stated differently, the device only needs to tolerate about 365 volts to enable a high voltage of about 730 volts to be applied to one of its terminals (the other terminal is grounded). Meanwhile, the thickness 90 of the isolation structure can remain about the same as conventional devices, since the embodiments herein need not rely on increase in thickness of the isolation structure 82 to improve its tolerance of high voltages. Additionally, the biased doped well 70 may also extend a depletion region in the substrate 30, which may further improve the device's electrical performance.

The HVJT devices 130-131 also help increase the breakdown voltage of the resistor device 100. In conventional high-voltage structures without the HVJT devices 130-131, a high electric field is concentrated near a P/N junction formed at a P-well and a high-voltage N-well. This concentrated electric field may have a sharp shape (e.g., a triangular shape) and may cause device breakdown at voltages less than about 100 volts. In comparison, by forming the HVJT device 130-131, the high-voltage device of the present disclosure may change the shape of the electric field to a more trapezoidal shape. Breakdown voltage is an integral over the area of the electric field. Due at least in part to its larger area, the trapezoidal-shaped electric field herein will yield a larger integral than traditional triangular-shaped electric fields. As such, the breakdown voltage is increased. Furthermore, the field plates 120-123 of the HVJT devices 130-131 also help reduce the intensity of the electric field, thereby further alleviating the breakdown issues.

FIGS. 2-8 illustrate one embodiment of the high-voltage semiconductor device, which implements the HVJT according to a single reduced surface field (RESURF) laterally-diffused metal oxide semiconductor (LDMOS) configuration. FIGS. 9-13 respectively illustrate alternative embodiments of the high-voltage semiconductor device having other HVJT configurations. For the sake of consistency and clarity, similar components appearing in FIGS. 2-8 are labeled the same throughout FIGS. 9-13.

Figure 9:
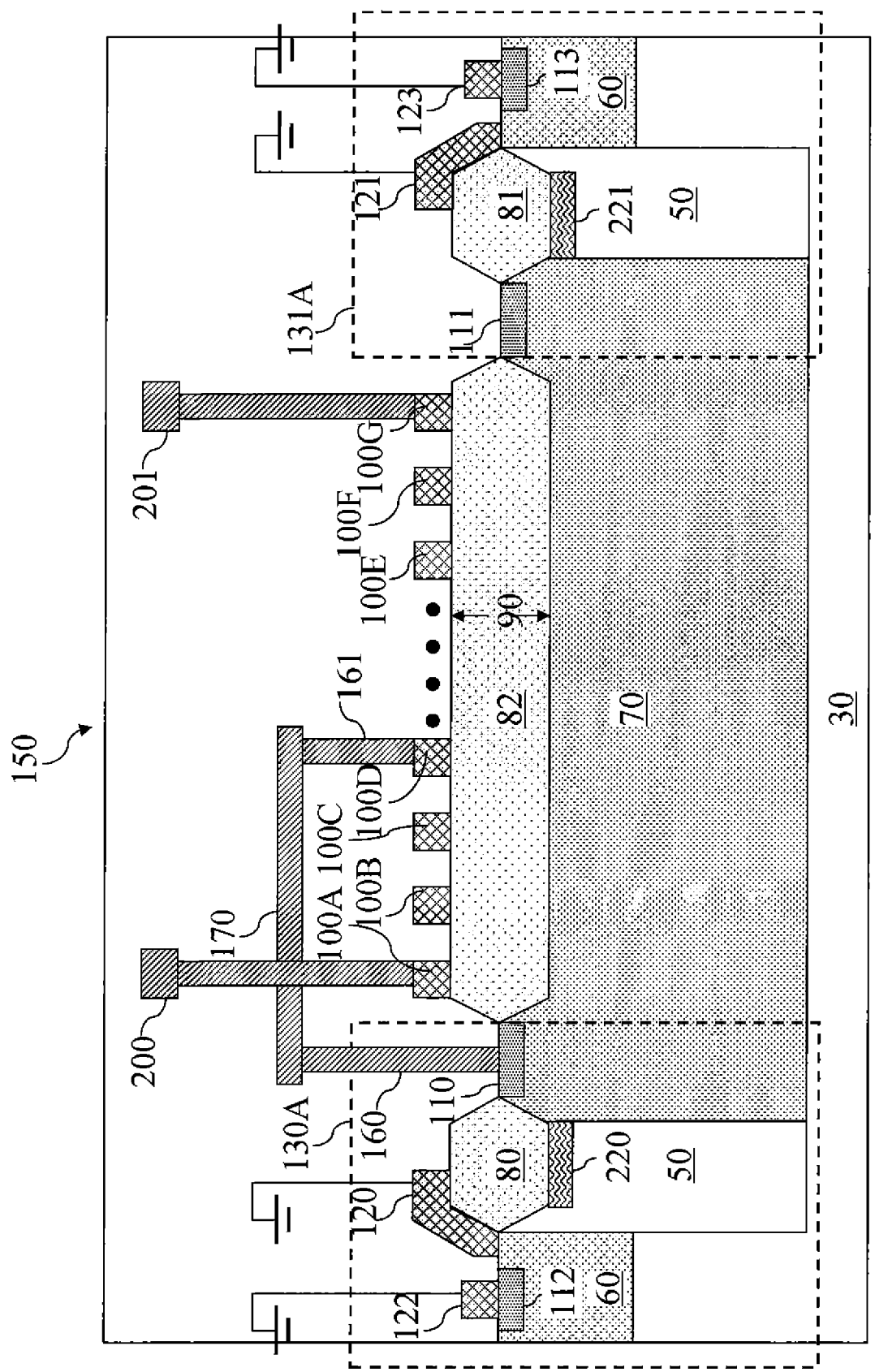

FIG. 9 illustrates a diagrammatic fragmentary cross-sectional side view of an embodiment of a high-voltage semiconductor device having a double RESURF LDMOS HVJT configuration. Here, the HVJT devices 130A-131A include doped wells 220-221, respectively. The doped wells 220-221 each have a doping polarity that is opposite from the doping polarity of the N-drift region 50. Thus, in the illustrated embodiment, the doped wells 220-221 are P-type wells. The doped wells 220-221 are formed immediately below the isolation structures 80-81, respectively, and at the top surface of the doped well 50. Hence, the doped wells 220-221 may also be referred to as P-top wells. The bottom surfaces of the doped wells 220-221 form P/N junctions with the doped well 50. The P/N junctions can also help reduce the intensity of the electric field in the high-voltage semiconductor device.

Figure 10:
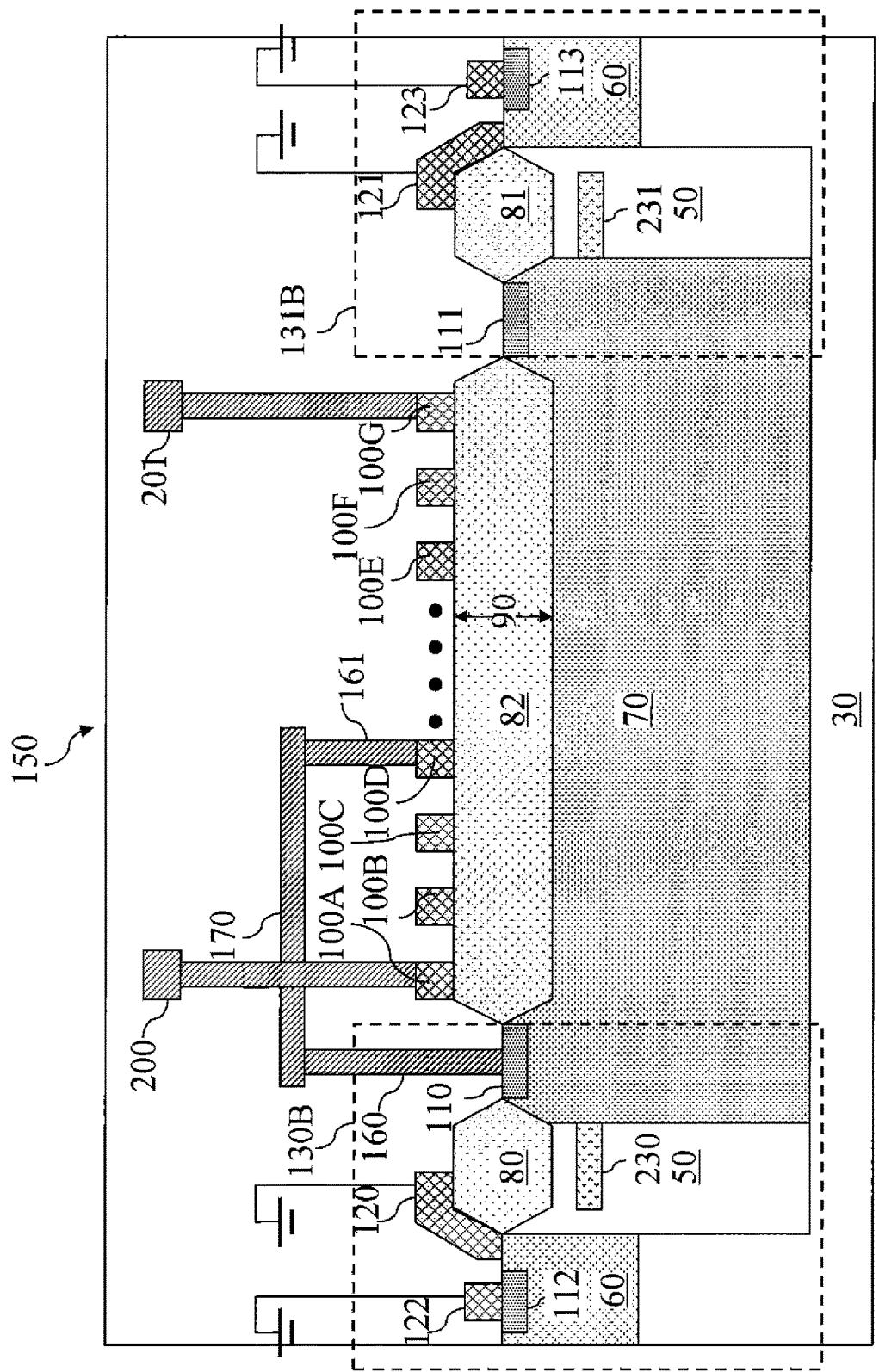

FIG. 10 illustrates a diagrammatic fragmentary cross-sectional side view of an embodiment of a high-voltage semiconductor device having a triple RESURF LDMOS HVJT configuration. Here, the HVJT devices 130B-131B include doped wells 230-231, respectively. The doped wells 230-231 each have a doping polarity that is opposite from the doping polarity of the N-drift region 50. Thus, in the illustrated embodiment, the doped wells 230-231 are P-type wells. The doped wells 230-231 are formed below the isolation structures 80-81, respectively, and are surrounded by the doped well 50. Hence, the doped wells 230-231 may also be referred to as buried P-wells. The top and bottom surfaces of the doped wells 230-231 form P/N junctions with the doped well 50. These P/N junctions can also help reduce the intensity of the electric field in the high-voltage semiconductor device.

Figure 11:
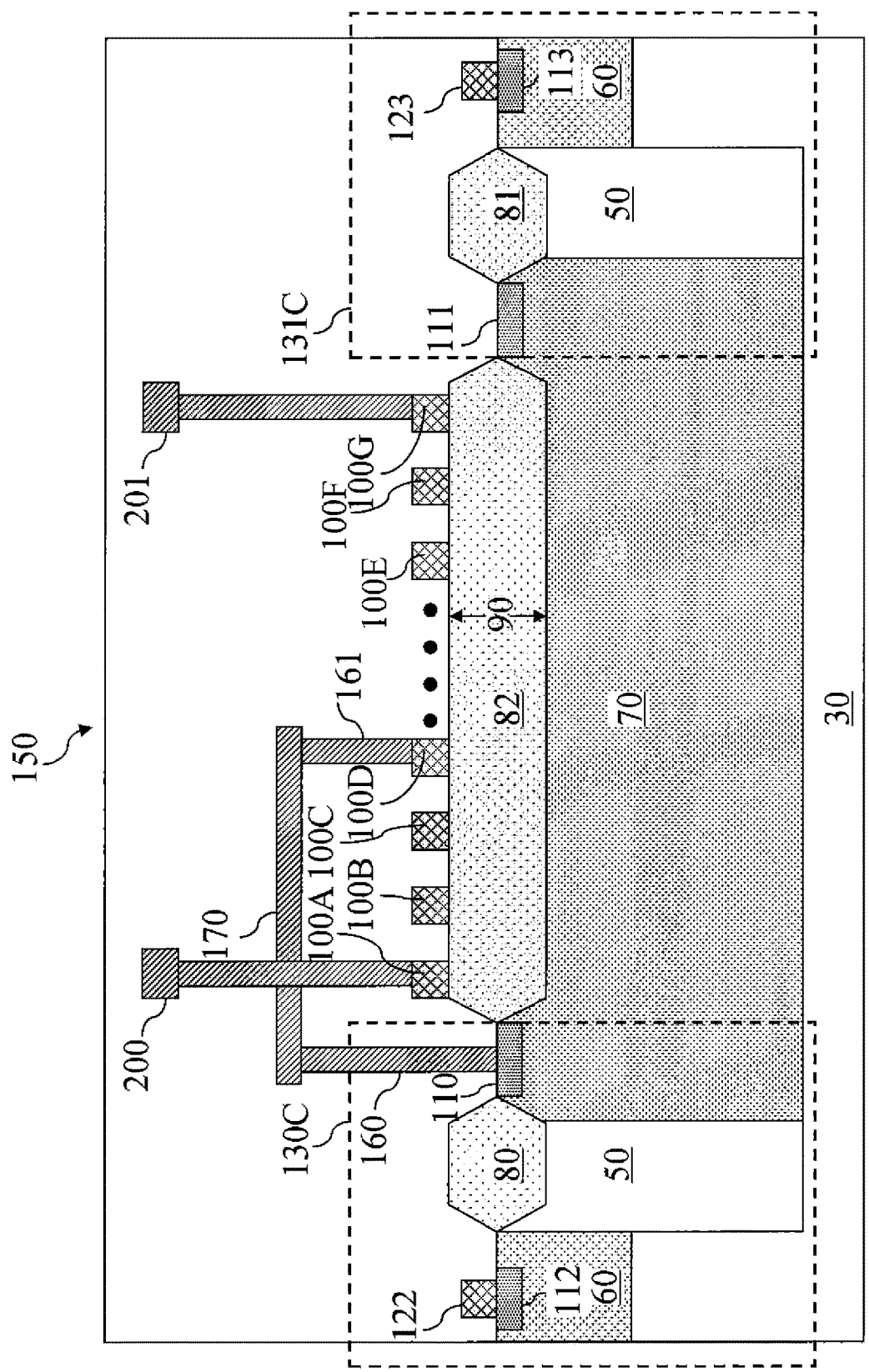
Figure 12:
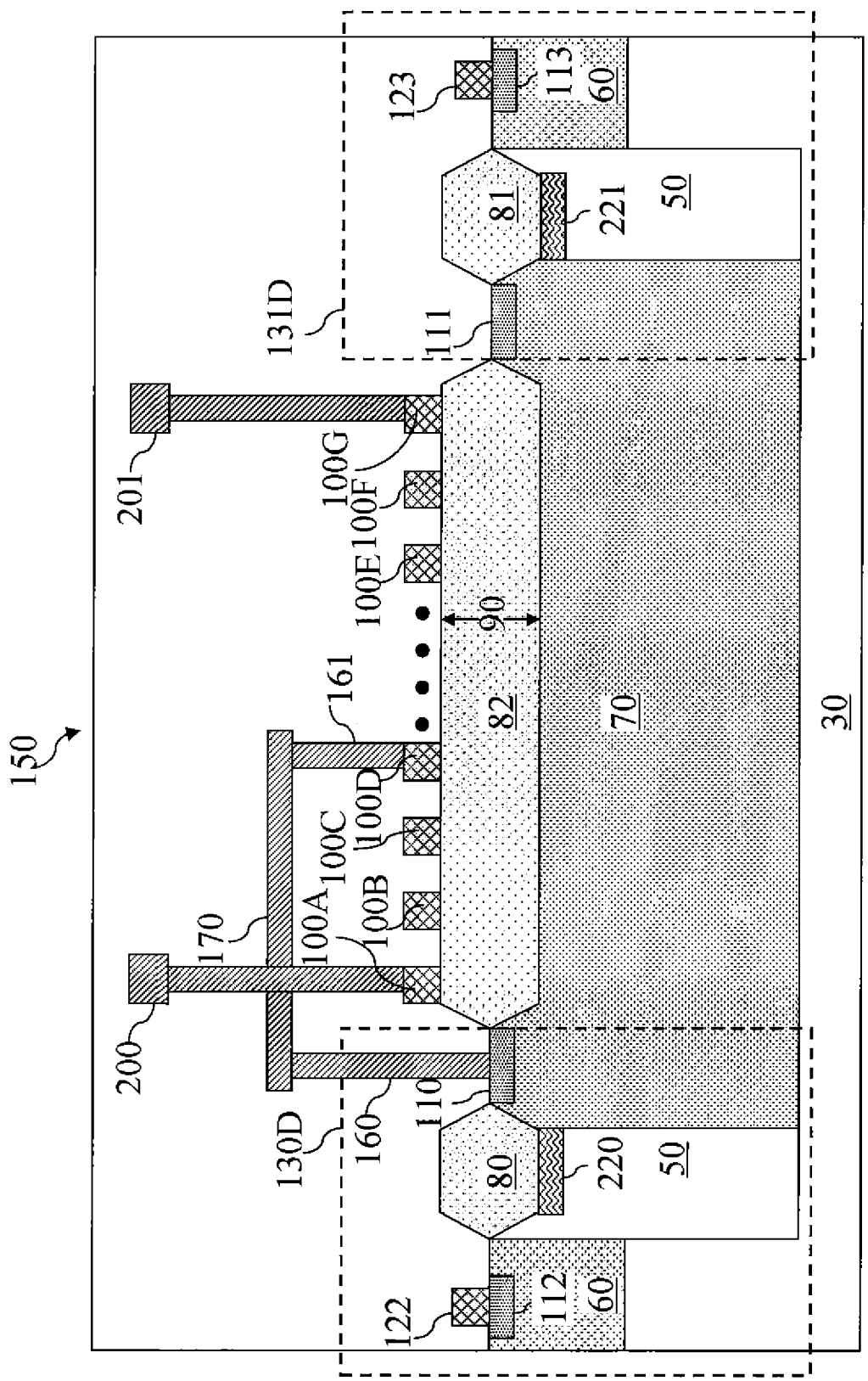
Figure 13:
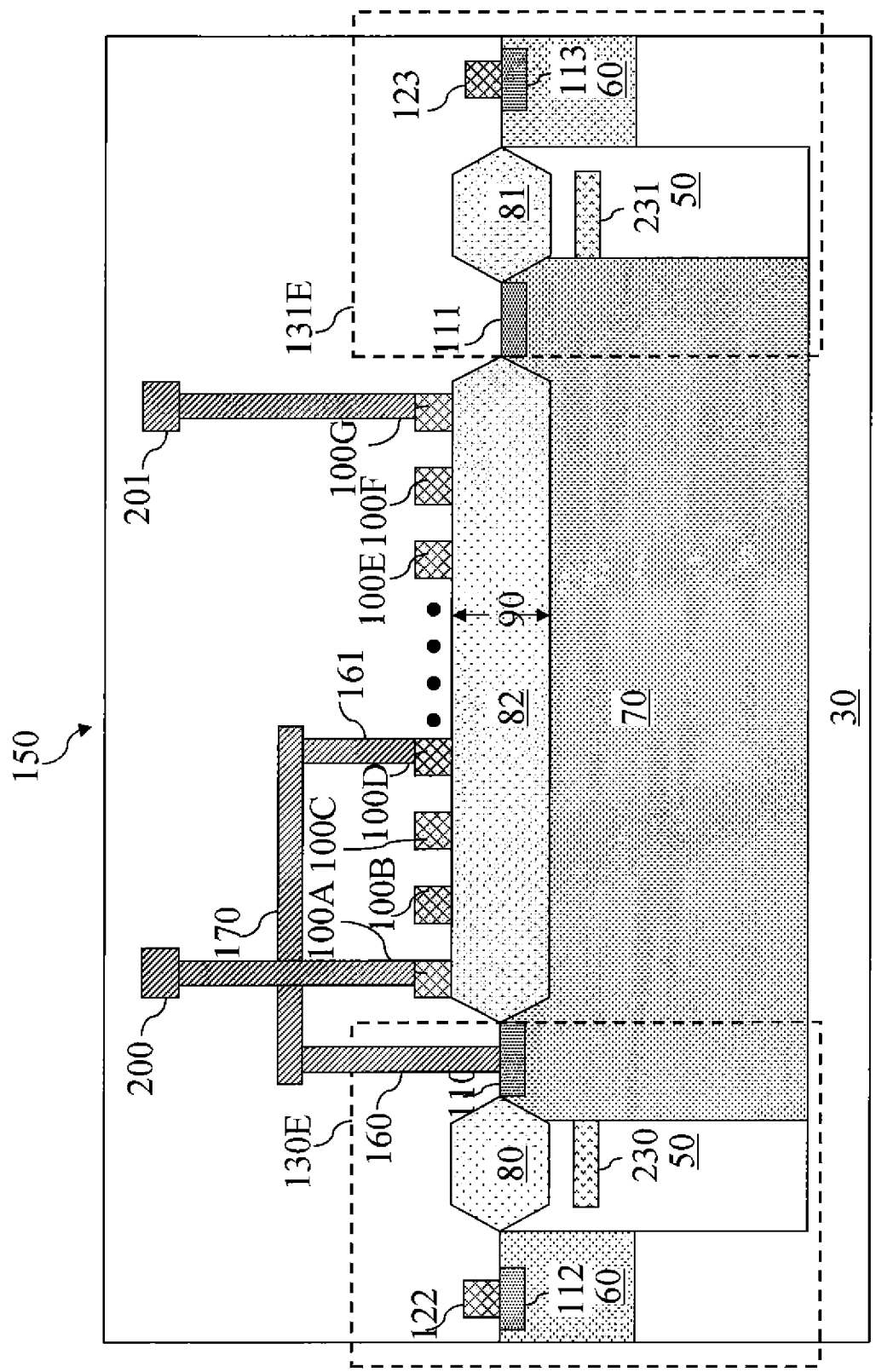

FIG. 11 illustrates a diagrammatic fragmentary cross-sectional side view of an embodiment of a high-voltage semiconductor device having a RESURF diode HVJT configuration. As shown in FIG. 11, the RESURF diode HVJT devices 130C-131C are diode structures, and therefore do not have gate structures. Anode and cathode terminals may be formed on the heavily doped regions 112/113 and 110/111, respectively. FIG. 12 illustrates a diagrammatic fragmentary cross-sectional side view of an embodiment of a high-voltage semiconductor device having a different RESURF diode HVJT configuration. As shown in FIG. 12, the RESURF diode HVJT devices 130D-131D also contain doped wells 220-211 (P-top wells), respectively. FIG. 13 illustrates a diagrammatic fragmentary cross-sectional side view of yet another embodiment of a high-voltage semiconductor device having another RESURF diode HVJT configuration. As shown in FIG. 13, the RESURF diode HVJT devices 130E-131E also contain doped wells 230-231 (buried P-wells), respectively. These various embodiments of the high-voltage semiconductor device offer similar breakdown improvements as the embodiment discussed above with reference to FIGS. 2-8.

It is understood that additional embodiments may exist, but they are not discussed in detail herein. For example, the field plates of the HVJT devices may have various shapes, sizes, and locations. The various doped wells and regions may also have different dimensions and doping concentration levels. It is also understood that additional fabrication processes may be performed to complete the fabrication of the semiconductor device shown in FIGS. 2-13. For example, the semiconductor device may undergo passivation, wafer acceptance testing, and wafer dicing processes. For the sake of simplicity, these additional processes are not shown or discussed herein either.

Figure 14:
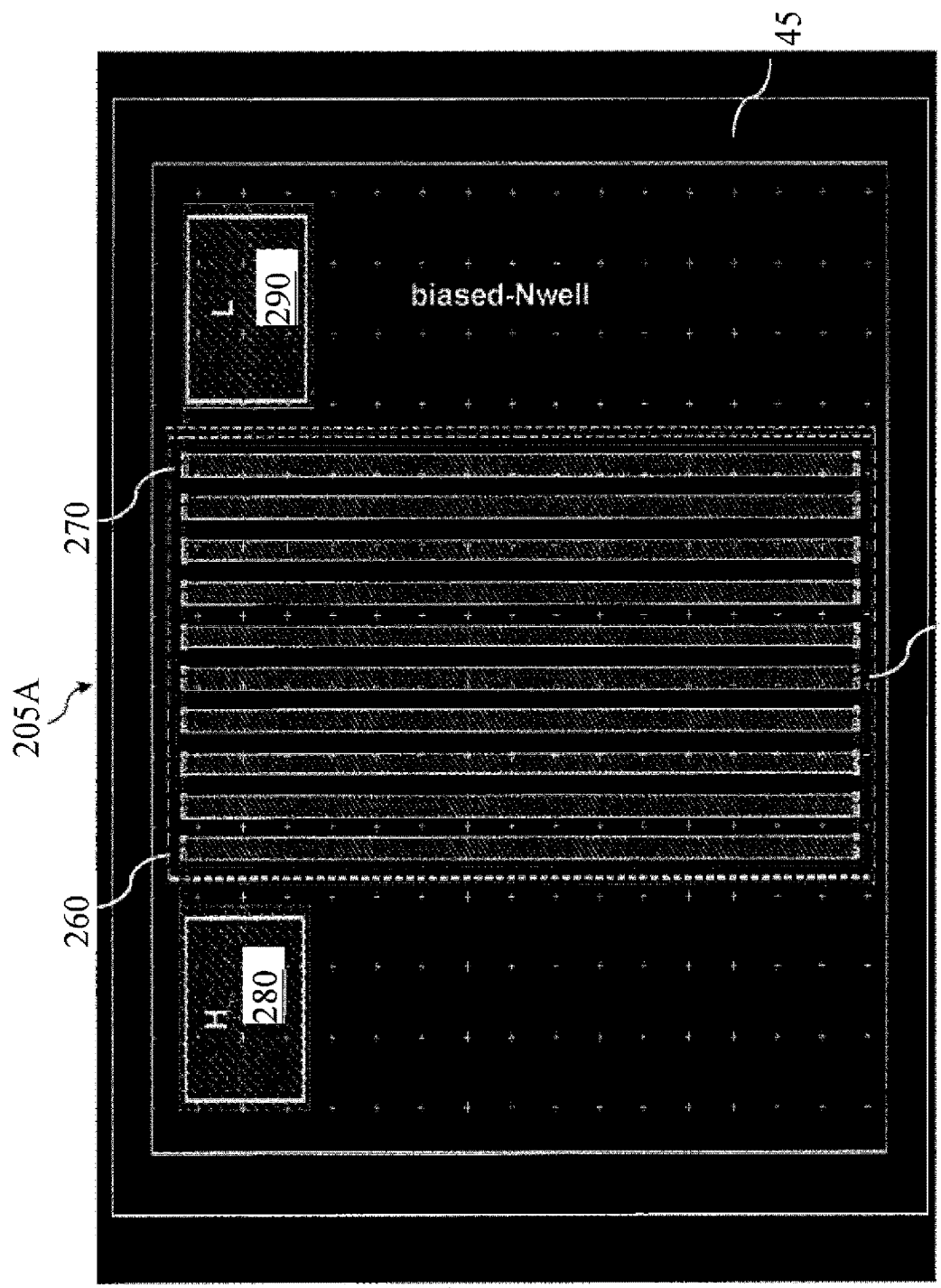
FIGS. 14-17 are simplified top views of different embodiments of a high voltage resistor according to various aspects of the present disclosure, respectively.

Referring now to FIG. 14, a simplified top view of an embodiment of a resistor device 250A is illustrated. The resistor device 250A is formed according to various aspects of the present disclosure discussed above. In this embodiment, the resistor device 250A has an elongated zig-zag shape, or an S-shape. The resistor device 250A has two opposite distal ends 260 and 270. The distal ends 260 and 270 are electrically coupled to terminals 280 and 290, respectively. A high voltage may be applied to the terminal 280 while the terminal 290 is grounded, or vice versa. Thus, a high voltage potential exists across the resistor device 250A through the terminals 280 and 290. The resistor device 250A has a midpoint 300 that is equidistant (in terms of distance along the resistor 250A, rather than absolute distance between two points) from the two distal ends 260 and 270. According to the various aspects of the present disclosure, a high voltage N-well underneath the resistor device 250A may be electrically coupled to the midpoint 300, or close to it (for example within 10% of the total length of the resistor device 250A). As discussed above, such configuration allows the resistor device 250A to have better breakdown performance—it can tolerate a higher voltage before breakdown occurs.

Figure 15:
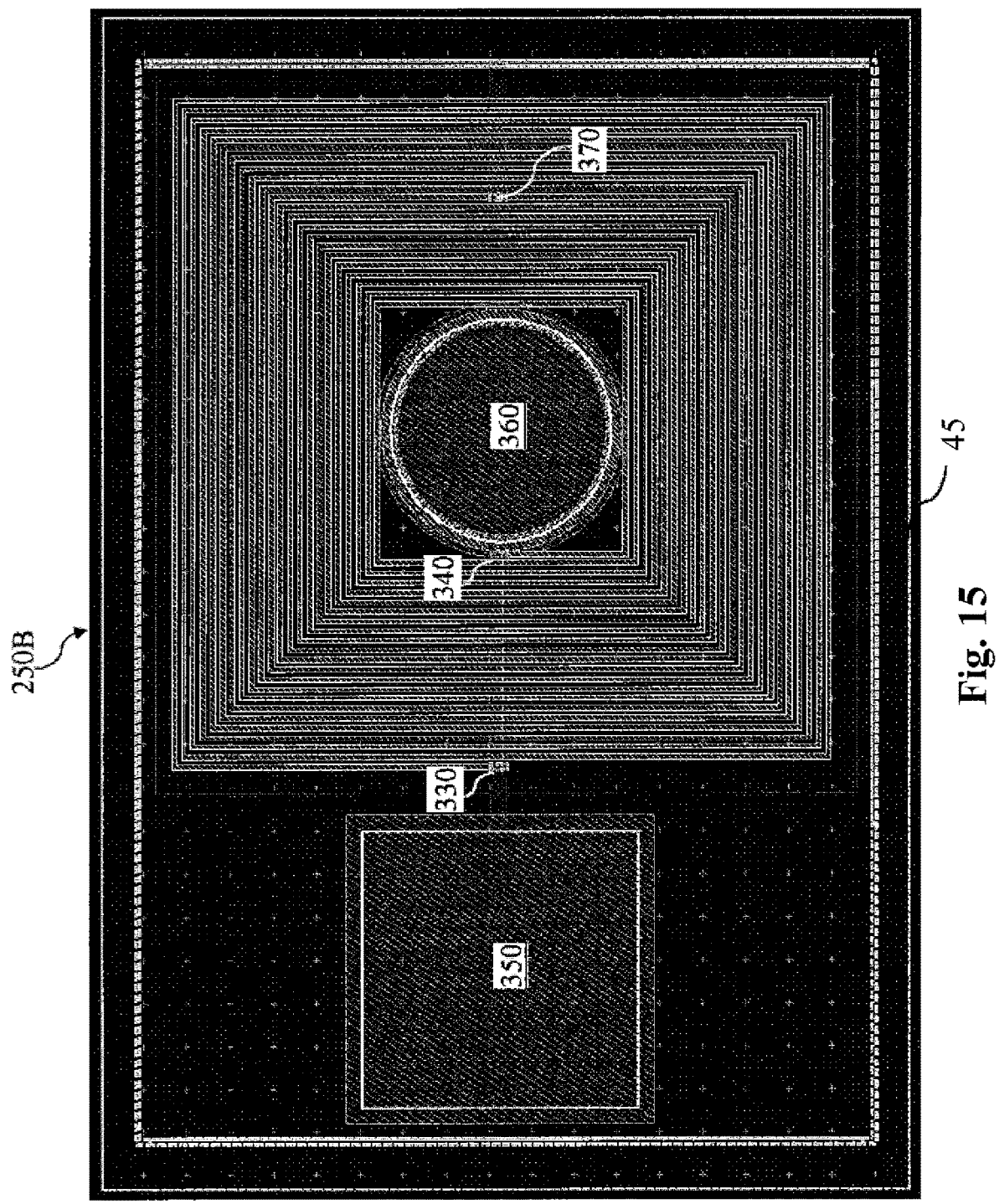

FIG. 15 illustrates another simplified top view of an embodiment of a resistor device 250B. The resistor device 250B is formed according to various aspects of the present disclosure discussed above. In this embodiment, the resistor device 250B has an elongated square shape. The resistor device 250B has two opposite distal ends 330 and 340. The distal ends 330 and 340 are electrically coupled to terminals 350 and 360, respectively. A high voltage may be applied to the terminal 350 while the terminal 360 is grounded, or vice versa. Thus, a high voltage potential exists across the resistor device 250B through the terminals 350 and 360. The resistor device 250B has a midpoint 370 that is equidistant (in terms of distance along the resistor 250B, rather than absolute distance between two points) from the two distal ends 330 and 340. According to the various aspects of the present disclosure, a high voltage N-well underneath the resistor device 250B may be electrically coupled to the midpoint 370, or close to it (for example within 10% of the total length of the resistor device 250B). For reasons similar to those discussed above with reference to FIG. 6, such configuration allows the resistor device 250B to have better breakdown performance.

Figure 16:
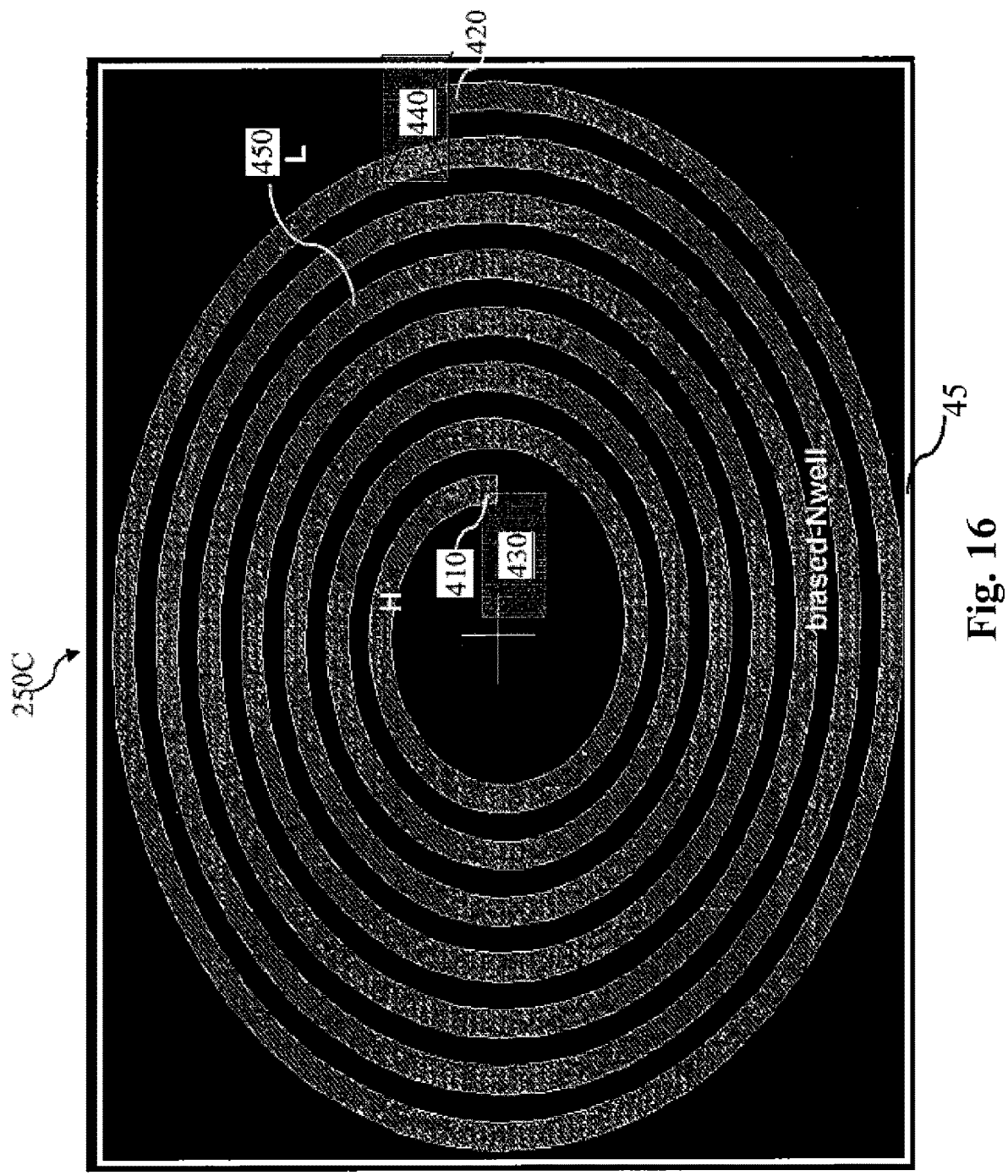

FIG. 16 illustrates another simplified top view of an embodiment of a resistor device 250C. The resistor device 250C is formed according to various aspects of the present disclosure discussed above. In this embodiment, the resistor device 250C has an elongated spiral shape. The resistor device 250C has two opposite distal ends 410 and 420. The distal ends 410 and 420 are electrically coupled to terminals 430 and 440, respectively. A high voltage may be applied to the terminal 430 while the terminal 440 is grounded, or vice versa. Thus, a high voltage potential exists across the resistor device 250C through the terminals 430 and 440. The resistor device 250C has a midpoint 450 that is equidistant (in terms of distance along the resistor 250C, rather than absolute distance between two points) from the two distal ends 410 and 420. According to the various aspects of the present disclosure, a high voltage N-well underneath the resistor device 250C may be electrically coupled to the midpoint 450, or close to it (for example within 10% of the total length of the resistor device 250C). For reasons similar to those discussed above with reference to FIG. 6, such configuration allows the resistor device 250C to have better breakdown performance.

Figure 17:
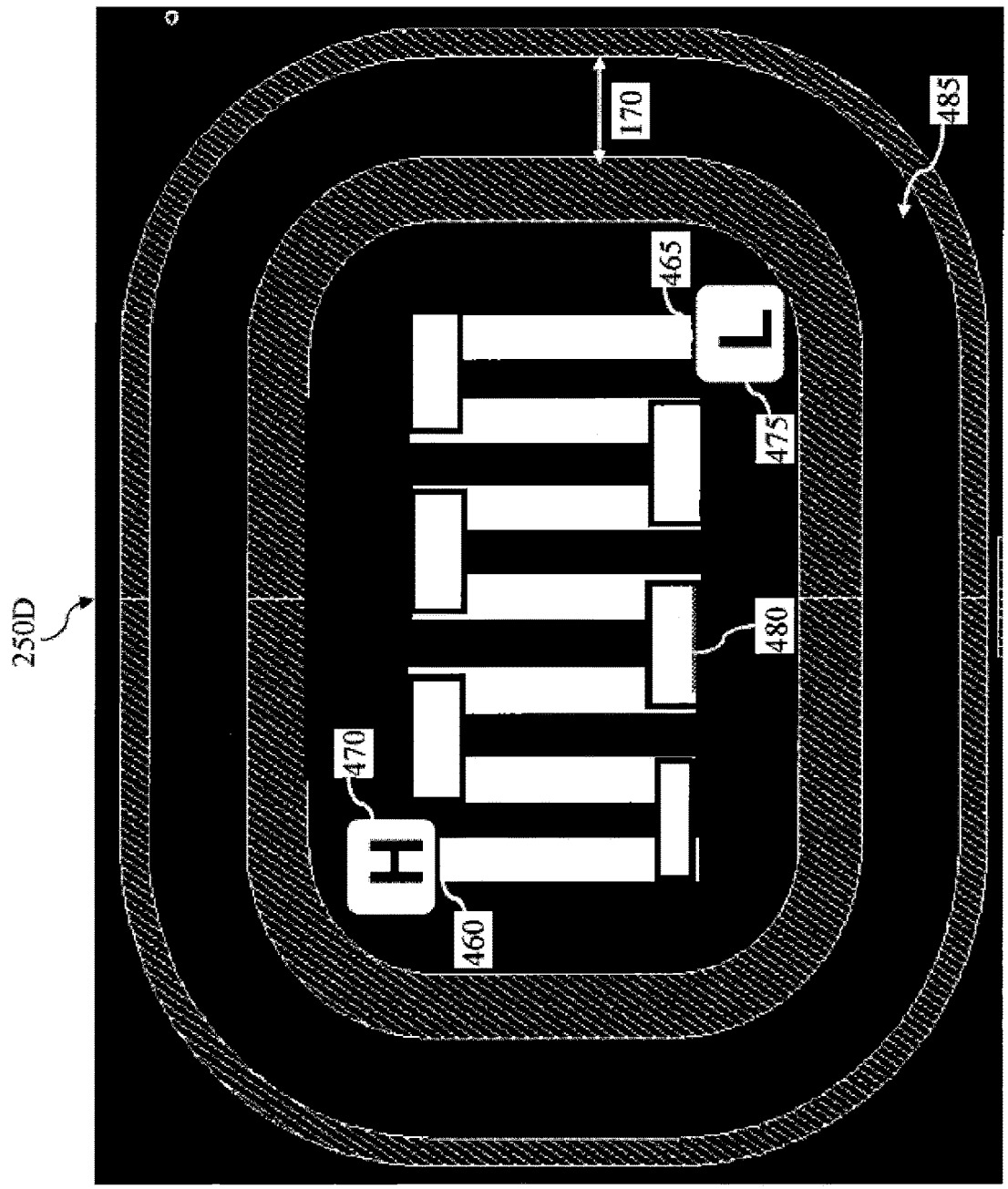

FIG. 17 illustrates another simplified top view of an embodiment of a resistor device 250D. The resistor device 250D is formed according to various aspects of the present disclosure discussed above. In this embodiment, the resistor device 250D has an elongated zig-zag shape, or an S-shape. The resistor device 250D has two opposite distal ends 460 and 465. The distal ends 460 and 465 are electrically coupled to terminals 470 and 475, respectively. A high voltage may be applied to the terminal 470 while the terminal 475 is grounded, or vice versa. Thus, a high voltage potential exists across the resistor device 250D through the terminals 470 and 475. The resistor device 250D has a midpoint 480 that is equidistant (in terms of distance along the resistor 250D, rather than absolute distance between two points) from the two distal ends 460 and 465. According to the various aspects of the present disclosure, a high voltage N-well underneath the resistor device 250D may be electrically coupled to the midpoint 480, or close to it (for example within 10% of the total length of the resistor device 250D).

As discussed above, such configuration allows the resistor device 250D to have better breakdown performance—it can tolerate a higher voltage before breakdown occurs.

The resistor device 250D has a high-voltage junction ring 485. The high voltage junction ring 485 surrounds the elongated resistor device in the top view. In an embodiment, the high voltage junction ring 485 includes the HVJT device as discussed above. The high voltage junction ring 485 has a ring width 170 that is in a range from about 5 um to about 100 um.

Figure 18:
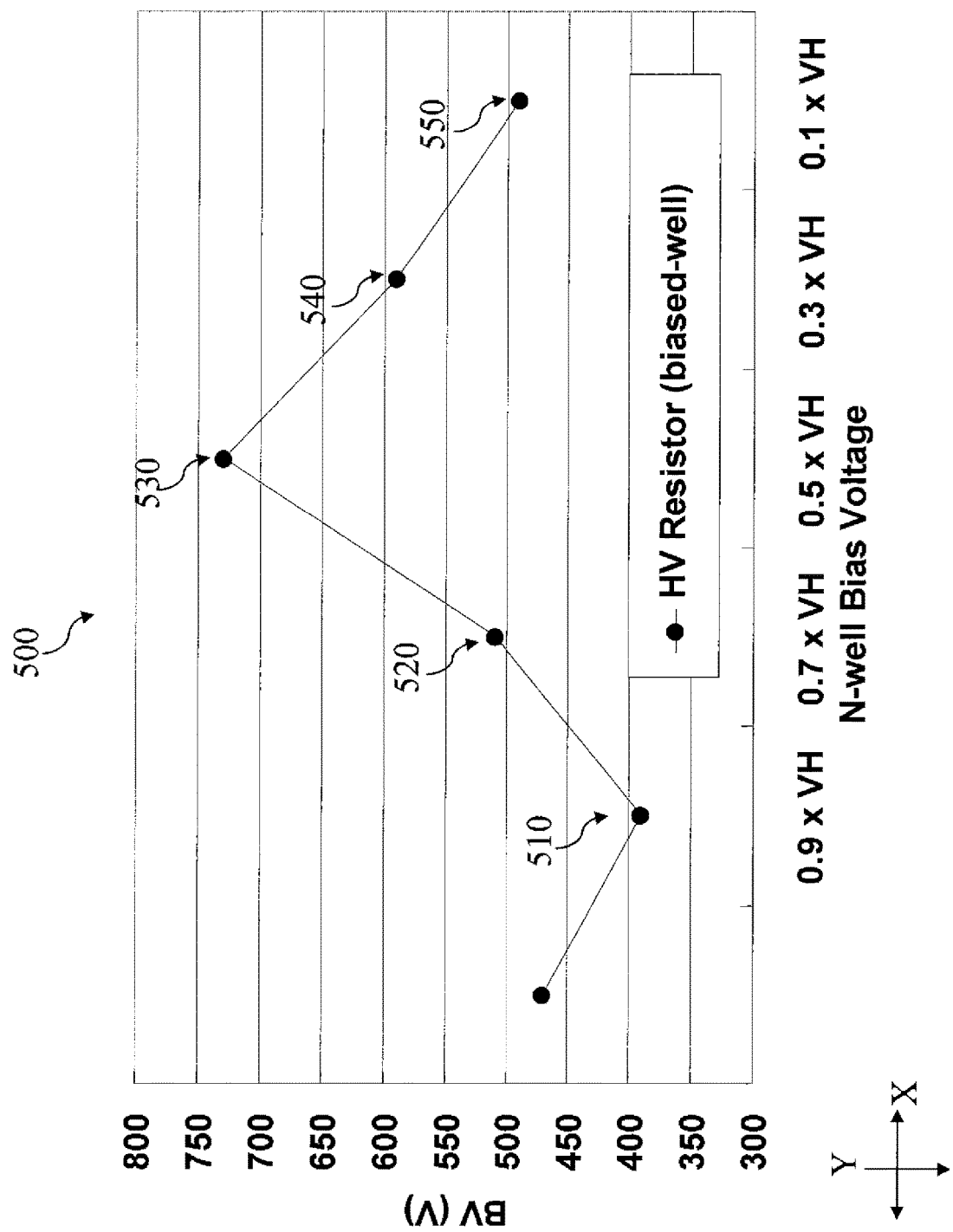
FIG. 18 is a chart illustrating a relationship between breakdown voltage VS electrical biasing voltage of a high voltage N-well according to various aspects of the present disclosure.

FIG. 18 is a chart 500 illustrating the relationship between breakdown voltage and the biased voltage of the high voltage N-well. An X-axis of the chart 500 represents the amount of bias voltage at the high voltage N-well below the resistor device. This bias voltage varies depending on where in the resistor device the high voltage N-well is tied to. A Y-axis of the chart 500 represents the breakdown voltage (BV). For example, at point 510, the high voltage N-well is tied to a point on the resistor device that is 0.1*L away from the high voltage distal end, where L=total length of the resistor device. Thus, the bias voltage of the N-well at point 510 is 0.9*VH, where VH=voltage difference applied across the resistor device. Since point 510 is relatively close to the distal end and not close to the midpoint of the resistor device, the breakdown voltage at point 510 is not optimal—slightly less than about 400 volts in this case.

Similarly, at point 520, the high voltage N-well is tied to a point on the resistor device that is 0.3*L away from the high voltage distal end, and the bias voltage of the N-well at point 520 is 0.7*VH. Since point 520 is closer to the midpoint of the resistor device than point 510, the breakdown voltage at point 520 is better—slightly greater than about 520 volts in this case—even though it is still not optimal yet.

At point 530, the high voltage N-well is tied to approximately the midpoint of the resistor device, and the bias voltage of the N-well at point 530 is 0.5*VH. The breakdown voltage at point 530 is now substantially optimal and reaches about 730 volts.

At points 540 and 550, the high voltage N-well is tied to points on the resistor device that is 0.7*L away and 0.9*L away from the high voltage distal end (or 0.3*L away and 0.1*L away from the low voltage distal end), respectively. Thus, the bias voltage at points 540 and 550 are at 0.3*VH and 0.1*VH, respectively, and the breakdown performance of the resistor device at points 540 and 550 once again begin suffer. Thus, from the chart 500, it can be seen that the resistor device tends to reach optimal breakdown performance when the high voltage N-well is tied close to the midpoint of the resistor device.

Figure 19:
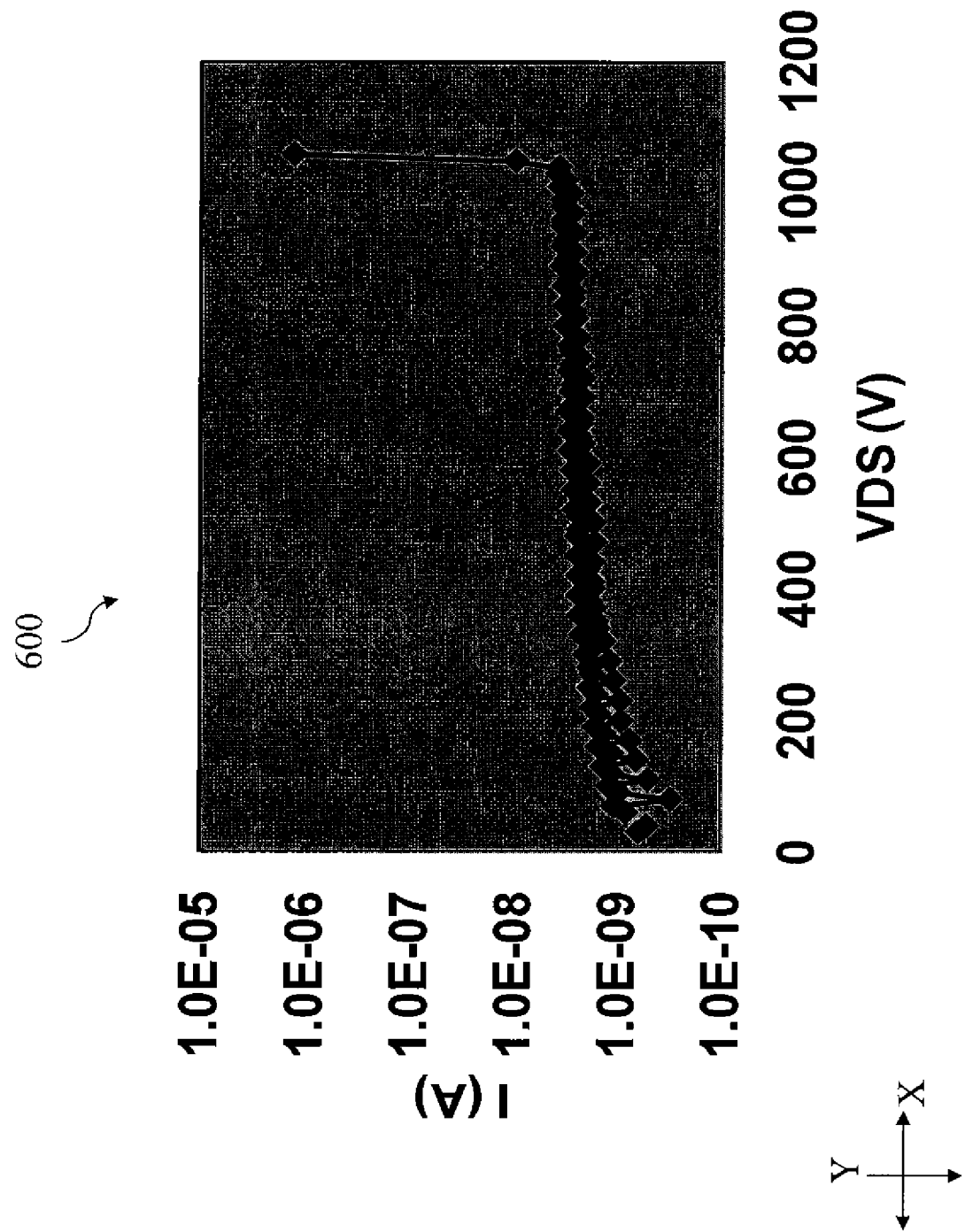
FIG. 19 is a chart graphically illustrating a voltage breakdown.

FIG. 19 is a chart 600 illustrating the breakdown voltage. An X-axis of the chart 600 represents the source-to-drain voltage (Vds), which is also the voltage across the high-voltage resistor device discussed herein. The Y-axis of the chart 600 represents the source-to-drain current (Ids), which is also the current in the high-voltage resistor device discussed herein. If the resistor device is functioning properly, Vds and Ids should have a linear relationship, as Vds=Ids*R, where R is the resistance of the resistor device. However, if the resistor device has suffered a breakdown, then the relationship between Vds and Ids is no longer linear.

The chart 600 contains a plot curve 610, which represents a simulation result of a Vds-Ids curve corresponding to an embodiment of the high-voltage semiconductor device. As is illustrated, the resistor device associated with plot curve 610 experiences device breakdown—where Ids begins to "shoot" upward—when Vds is about 1000 volts. This breakdown voltage is a significant improvement over the breakdown voltage offered by conventional high-voltage resistor devices.

It is understood that various factors may influence the breakdown voltage. For example, changing the size (or lateral dimension) of the N-drift region may affect the breakdown voltage. Changing the HVJT device may also affect the breakdown voltage. An optimum configuration may be chosen according to design and manufacturing concerns.

The embodiments discussed above offer advantages over conventional high voltage devices, it being understood that different embodiments may offer different advantages, and that no particular advantage is required for all embodiments. One advantage is that through proper biasing of the high voltage N-well, the breakdown performance of the resistor device can be significantly improved.

Another advantage is that, by incorporating HVJT devices, electric field intensity is reduced, which can increase the breakdown voltage to over 1000 volts. Furthermore, the N-well biasing discussed above can also in effect double the breakdown voltage (if the midpoint of the resistor is electrically coupled to the N-well). As such, the breakdown voltage can be increased to 2000 volts.

Yet another advantage is that the biasing of the high voltage N-well and the formation of the HVJT devices require no additional fabrication processes and are compatible with existing process flow. Thus, the implementation of the embodiments discussed herein does not increase costs.

One of the broader forms of the present disclosure involves a semiconductor device that includes: a substrate containing a first doped region and a second doped region, the first and second regions being oppositely doped; a first isolation structure and a second isolation structure each disposed over the substrate, the first and second isolation structures being spaced apart from one another; a resistor disposed over at least a portion of the first isolation structure; and a field plate disposed over at least a portion of one of the first and second doped regions.

Another one of the broader forms of the present disclosure involves a semiconductor device that includes: a substrate that includes a doped well disposed therein, the doped well and the substrate having opposite doping polarities; an insulating device disposed over the doped well; an elongate resistor disposed over the insulating device, a non-distal portion of the resistor being coupled to the doped well; and a high-voltage junction termination (HVJT) device disposed adjacent to the resistor.

One more of the broader forms of the present disclosure involves a method of fabricating a high voltage semiconductor device. The method includes: forming a first doped region in a substrate; forming a second doped region in the substrate, the second doped region being oppositely doped from the first doped region, wherein an interface between the first and second doped regions forms a P/N junction; forming first and second isolation structures over the first doped region; forming a resistor device over the first isolation structure; and forming a field plate at least partially over the second isolation structure, the field plate being disposed over the P/N junction.

In some embodiments, an exemplary semiconductor device includes a first doped region and a second doped region disposed in a substrate. The first doped region and the second doped region are oppositely doped and adjacently disposed in the substrate. A first isolation structure and a second isolation structure are disposed over the substrate, such that each are disposed at least partially over the first doped region. The first isolation structure is spaced apart from the second isolation structure. A resistor is disposed over a portion of the first isolation structure and electrically coupled to the first doped region. A field plate disposed over a portion of the second doped region and electrically coupled to the second doped region.

In some embodiments, an exemplary semiconductor device includes a diode-based high-voltage junction termination (HVJT) device and a resistor electrically coupled to the diode-based HVJT device. The diode-based HVJT device includes a first doped region and a second doped region disposed in a substrate, the first doped region and the second doped region having opposite doping polarities and being adjacently disposed in the substrate, a cathode terminal electrically coupled to the first doped region, and an anode terminal electrically coupled to the second doped region. The semiconductor device can further include an isolation structure disposed over a portion of the first doped region, and the resistor may be disposed over a portion of the isolation structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device comprising:
a first doped region, a second doped region, and a third doped region disposed in a substrate, wherein the first doped region and the second doped region have opposite dopant polarity and the second doped region and the third doped region have the same dopant polarity, and further wherein the first doped region is disposed adjacent to the second doped region, such that an interface between the first doped region and the second doped region forms a P/N junction, and further wherein the third doped region is disposed in the second doped region;
a first isolation structure and a second isolation structure each disposed over the substrate, wherein the first isolation structure is completely disposed over the third doped region and the second isolation structure is disposed over an entire portion of the second doped region that is disposed between the first doped region and the third doped region;
a resistor disposed over a portion of the first isolation structure and electrically coupled to the third doped region; and
a field plate disposed over a portion of the first doped region and electrically coupled to the first doped region.

2. The semiconductor device of claim 1, wherein a non-distal portion of the resistor is electrically coupled to the third doped region.

3. The semiconductor device of claim 2, wherein the resistor has a length L, and the non-distal portion of the resistor is located away from a distal end of the resistor by a distance that is in a range from about 0.4*L to about 0.6*L.

4. The semiconductor device of claim 2, further comprising an interconnect structure, wherein the interconnect structure includes:
   a first contact electrically coupled to the third doped region;
   a second contact electrically coupled to the non-distal portion of the resistor; and
   an interconnect line electrically coupled to the first contact and the second contact.

5. The semiconductor device of claim 4, wherein:
   the resistor includes a first distal end opposite a second distal end; and
   the interconnect structure further includes a first terminal electrically coupled to the first distal end and a second terminal electrically coupled to the second distal end.

6. The semiconductor device of claim 1, wherein a doping concentration of the third doped region is greater than a doping concentration of the second doped region.

7. The semiconductor device of claim 1, further comprising a fourth doped region disposed in the first doped region, wherein the fourth doped region and the first doped region have the same doping polarity, a doping concentration of the fourth doped region is higher than a doping concentration of the first doped region, and the field plate is electrically coupled to the fourth doped region.

8. The semiconductor device of claim 1, further comprising a fourth doped region disposed below the second isolation structure in the second doped region, wherein the fourth doped region and the second doped region have different doping polarity, such that at least one P/N junction is formed between the second doped region and the fourth doped region.

9. A semiconductor device, comprising:
   a diode-based high-voltage junction termination (HVJT) device that does not include a gate structure, the diode-based HVJT device having:
      a first doped region and a second doped region disposed in a substrate, the first doped region and the second doped region having opposite doping polarities and being adjacently disposed in the substrate, such that a first P/N junction is between the first doped region and the second doped region,
      a third doped region disposed in the first doped region, the third doped region having the same doping polarity as the first doped region,
      a cathode terminal electrically coupled to the third doped region, and
      an anode terminal electrically coupled to the second doped region;
   an isolation structure, an entirety of the isolation structure being disposed directly on the third doped region; and
   a resistor disposed over a portion of the isolation structure, wherein the resistor is electrically coupled to the diode-based HVJT device.

10. The semiconductor device of claim 9, wherein the diode-based HVJT device further includes:
   a first heavily doped region disposed in the third doped region, wherein the first heavily doped region has a same doping polarity as the third doped region and a higher doping concentration than the third doped region, and further wherein the cathode terminal is electrically coupled to the first heavily doped region; and
   a second heavily doped region disposed in the second doped region, wherein the second heavily doped region has a same doping polarity as the second doped region and a higher doping concentration than the second doped region, and further wherein the anode terminal is electrically coupled to the second heavily doped region.

11. The semiconductor device of claim 10, wherein:
   the cathode terminal includes a contact disposed on the first heavily doped region; and
   the anode terminal includes a field plate disposed on the second heavily doped region.

12. The semiconductor device of claim 9, wherein the first doped region is electrically coupled to an approximate midpoint of the resistor.

13. The semiconductor device of claim 9, wherein the resistor includes a non-distal portion located between a first distal end opposite a second distal end, the non-distal portion being electrically coupled to the third doped region.

14. The semiconductor device of claim 9, wherein the first doped region includes n-type dopant, the second doped region includes p-type dopant, and the third doped region includes n-type dopant.

15. The semiconductor device of claim 9, further comprising a fourth doped region disposed in the first doped region, the fourth doped region having an opposite doping polarity than the first doped region, such that a second P/N junction is between a top surface of the fourth doped region and the first doped region and a third P/N junction is between a bottom surface of the fourth doped region and the first doped region.

16. A method for fabricating a semiconductor device, the method comprising:
   forming a first doped region in a substrate;
   forming a second doped region in the substrate, wherein the second doped region and the first doped region have opposite dopant polarity, and further wherein the second doped region is disposed adjacent to the first doped region, such that an interface between the first doped region and the second doped region forms a P/N junction;
   forming a third doped region in the substrate, wherein the third doped region and the second doped region have the same dopant polarity, and further wherein the third doped region is disposed in the second doped region;
   forming a first isolation structure and a second isolation structure, wherein the first isolation structure is completely disposed over the third doped region and the second isolation structure is disposed over an entire portion of the second doped region that is disposed between the first doped region and the third doped region;
   forming a resistor over the first isolation structure;
   forming a field plate over the first doped region; and
   forming an interconnect structure that electrically couples the resistor to the third doped region.

17. The method of claim 16, wherein the forming the resistor is carried out in a manner such that the resistor includes a non-distal portion located between a first distal end opposite a second distal end, the non-distal portion being electrically coupled to the third doped region.

18. The method of claim 17, wherein the forming the interconnect structure includes:
   forming a first contact over the third doped region;
   forming a second contact over the non-distal portion of the resistor; and
   forming an interconnect line connects the first contact and the second contact.

19. The method of claim 16, further comprising forming a fourth doped region in the first doped region, wherein the fourth doped region and the first doped region have the same doping polarity, a doping concentration of the fourth doped region is higher than a doping concentration of the first doped region, and the field plate is electrically coupled to the fourth doped region.

20. The method of claim 16, further comprising forming a fourth doped region disposed below the second isolation structure in the second doped region, wherein the fourth doped region and the second doped region have different doping polarity, such that at least one P/N junction is formed between the second doped region and the fourth doped region.

* * * * *